(12) United States Patent
Oh et al.

(10) Patent No.: US 9,087,790 B2
(45) Date of Patent: Jul. 21, 2015

(54) METHOD OF FABRICATING THREE-DIMENSIONAL SEMICONDUCTOR DEVICE AND THREE-DIMENSIONAL SEMICONDUCTOR DEVICE FABRICATED USING THE SAME

(71) Applicants: Jung-Ik Oh, Seongnam-si (KR); Daehyun Jang, Seongnam-si (KR); Ha-Na Kim, Seoul (KR); Seongsoo Lee, Seongnam-si (KR)

(72) Inventors: Jung-Ik Oh, Seongnam-si (KR); Daehyun Jang, Seongnam-si (KR); Ha-Na Kim, Seoul (KR); Seongsoo Lee, Seongnam-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 71 days.

(21) Appl. No.: 13/949,600

(22) Filed: Jul. 24, 2013

(65) Prior Publication Data

US 2014/0106569 A1   Apr. 17, 2014

(30) Foreign Application Priority Data

Oct. 16, 2012  (KR) ........................ 10-2012-0114864

(51) Int. Cl.
*H01L 21/311* (2006.01)
*H01L 21/308* (2006.01)
*H01L 27/115* (2006.01)

(52) U.S. Cl.
CPC ........ *H01L 21/308* (2013.01); *H01L 21/31144* (2013.01); *H01L 27/11529* (2013.01); *H01L 27/11548* (2013.01); *H01L 27/11556* (2013.01); *H01L 27/11573* (2013.01); *H01L 27/11575* (2013.01); *H01L 27/11582* (2013.01)

(58) Field of Classification Search
CPC ........... H01L 21/308; H01L 21/31144; H01L 27/11529; H01L 27/11548; H01L 27/11556; H01L 27/11573; H01L 27/11575; H01L 27/11582
USPC .................................................. 438/700, 703
See application file for complete search history.

(56) References Cited

U.S. PATENT DOCUMENTS

| 7,592,225 | B2 | 9/2009 | Kai et al. |
| 7,662,697 | B2 * | 2/2010 | Ahn et al. ...................... 438/427 |
| 8,058,683 | B2 | 11/2011 | Yoon et al. |
| 8,343,820 | B2 | 1/2013 | Jung |
| 8,394,716 | B2 * | 3/2013 | Hwang et al. .................. 438/667 |

(Continued)

FOREIGN PATENT DOCUMENTS

| KR | 20110001527 A | 1/2011 |
| KR | 20110013701 A | 2/2011 |

(Continued)

*Primary Examiner* — Nicholas Tobergte
(74) *Attorney, Agent, or Firm* — Harness, Dickey & Pierce, P.L.C.

(57) ABSTRACT

According to example embodiments of inventive concepts, a method of fabricating a 3D semiconductor device may include: forming a stack structure including a plurality of horizontal layers sequentially stacked on a substrate including a cell array region and a contact region; forming a first mask pattern covering the cell array region and defining openings extending in one direction over the contact region; performing a first etching process with a first etch-depth using the first mask pattern as an etch mask on the stack structure; forming a second mask pattern covering the cell array region and exposing a part of the contact region; and performing a second etching process with a second etch-depth using the second mask pattern as an etch mask structure on the stack structure. The second etch-depth may be greater than the first etch-depth.

16 Claims, 34 Drawing Sheets

(56) References Cited

U.S. PATENT DOCUMENTS

| | | |
|---|---|---|
| 8,395,190 B2 | 3/2013 | Shim et al. |
| 8,659,946 B2 * | 2/2014 | Jin et al. .................. 365/185.17 |
| 2002/0137273 A1 * | 9/2002 | Won et al. ..................... 438/238 |
| 2006/0258098 A1 * | 11/2006 | Lee ............................... 438/258 |
| 2007/0004167 A1 * | 1/2007 | Lee ............................... 438/427 |
| 2007/0066030 A1 * | 3/2007 | Kim ............................... 438/427 |
| 2008/0171428 A1 | 7/2008 | Kai et al. |
| 2008/0173936 A1 | 7/2008 | Yoon et al. |
| 2010/0090286 A1 | 4/2010 | Lee et al. |
| 2010/0163968 A1 * | 7/2010 | Kim et al. ..................... 257/324 |
| 2010/0173470 A1 * | 7/2010 | Lee et al. ..................... 438/427 |
| 2011/0018036 A1 | 1/2011 | Hwang et al. |
| 2011/0059595 A1 | 3/2011 | Jung |
| 2011/0115010 A1 | 5/2011 | Shim et al. |

FOREIGN PATENT DOCUMENTS

| | | |
|---|---|---|
| KR | 20110015337 A | 2/2011 |
| KR | 20110015338 A | 2/2011 |
| KR | 10-1094957 B1 | 12/2011 |

\* cited by examiner

US 9,087,790 B2

METHOD OF FABRICATING THREE-DIMENSIONAL SEMICONDUCTOR DEVICE AND THREE-DIMENSIONAL SEMICONDUCTOR DEVICE FABRICATED USING THE SAME

CROSS-REFERENCE TO RELATED APPLICATIONS

This U.S. non-provisional patent application claims priority under 35 U.S.C. §119 to Korean Patent Application No. 10-2012-0114864, filed on Oct. 16, 2012, the entire disclosure of which is incorporated by reference herein.

BACKGROUND

Example embodiments of inventive concepts relate to a method of fabricating a semiconductor device and/or a semiconductor device fabricated using the same and, more particularly, to a method of fabricating a three-dimensional semiconductor device including a stepped stack structure and/or a three-dimensional semiconductor device fabricating using the same.

Semiconductor devices are becoming more highly integrated to meet the desires of customers (e.g., in order to provide high performance and low costs thereof).

The integration density of the semiconductor memory devices may directly affect the costs thereof. Thus, the high integration density of the semiconductor memory devices may be increasingly demanded. The integration density of conventional two-dimensional (2D) or planar semiconductor memory devices may be mostly influenced by a planar area in which a unit memory cell occupies. Thus, the integration density of the conventional 2D or planar semiconductor memory devices may be influenced by a process technology for forming fine patterns. However, improving the process technology for forming the fines patterns may be limited the cost of equipment and/or difficulties of the process technology.

Three-dimensional (3D) semiconductor memory devices have been proposed. However, a process technology capable of reducing cost per bit than the 2D semiconductor memory devices and of improving reliability may be demanded for mass production of the 3D semiconductor memory devices.

SUMMARY

Example embodiments of inventive concepts may provide a method of fabricating a three-dimensional semiconductor device capable of simplifying a formation process of a stepped stack structure.

Example embodiments of inventive concepts may also provide a three-dimensional semiconductor device including a stepped stack structure.

According to example embodiments of inventive concepts, a method of fabricating a three-dimensional (3D) semiconductor device may include: forming a stack structure including a plurality of horizontal layers sequentially stacked on a substrate, the substrate including a cell array region and a contact region; forming a first mask pattern covering the cell array region, the first mask pattern defining openings extending in one direction over the contact region; performing a first etching process with a first etch-depth using the first mask pattern as an etch mask on the stack structure; forming a second mask pattern covering the cell array region and exposing a part of the contact region; and performing a second etching process with a second etch-depth using the second mask pattern as an etch mask structure on the stack structure, the second etch-depth being greater than the first etch-depth.

In example embodiments of inventive concepts, the performing the first etching process may include: etching a part of the stack structure exposed by the first mask pattern to first etch-depth, and the first etch-depth may corresponds to a vertical pitch of one of the plurality of horizontal layers. In example embodiments of inventive concepts, the performing the second etching process may include: etching a portion of the stack structure to the second etch-depth, and the second etch-depth may correspond to at least twice the vertical pitch of one of the plurality of horizontal layers.

In example embodiments of inventive concepts, after performing the second etching process, the method may further include: repeatedly performing a process of shrinking a planar area of the second mask pattern and performing the second etching process using the shrunk second mask pattern as an etch mask.

In example embodiments of inventive concepts, the repeatedly performing the process of shrinking the planar area of the second mask pattern may include laterally moving a sidewall of the second mask pattern by twice a width of the opening of the first mask pattern.

According to example embodiments of inventive concepts, a three-dimensional (3D) semiconductor device may include: a substrate including a cell array region, a dummy region, and a contact region, the contact region being adjacent to the cell array region in a first direction, the dummy region being adjacent to the cell array region in a second direction, the second direction being perpendicular to the first direction; and a stack structure including horizontal electrodes vertically stacked on the substrate. The stack structure may have a first stepped structure on the contact region and a second stepped structure on the dummy region. A vertical height of the first stepped structure may increase stepwise with a first vertical pitch toward the cell array region. A vertical height of the second stepped structure may increase stepwise with a second vertical pitch, being twice the first vertical pitch, toward the cell array region.

In example embodiments of inventive concepts, each of the horizontal electrodes may include a first sidewall on the contact region and a second sidewall on the dummy region. The first sidewalls of the horizontal electrodes may be at horizontal positions different from each other, respectively, on the contact region. The second sidewalls of at least two horizontal layers vertically adjacent to each other may be vertically aligned with each other on the dummy region.

In example embodiments of inventive concepts, the first sidewalls of the horizontal electrodes may be spaced apart from each other by a first horizontal distance, and the second sidewalls of the horizontal electrodes, that are vertically adjacent to each other and are at heights different from each other, may be spaced apart from each other by a second horizontal distance. The second horizontal distance may be twice the first horizontal distance.

According to example embodiments of inventive concepts, a method of fabricating a three-dimensional (3D) semiconductor device may include: forming a stack structure including a plurality of horizontal stacked on a first region and a second region of a substrate, the plurality of horizontal layers including odd horizontal layers alternately stacked with even horizontal layers; performing one of a first process and a first method on the stack structure; and performing an other of the first process and the first method on the stack structure. The first process may include: forming a mask on the first and second region of the substrate, the mask defining a plurality of openings that are spaced apart from each other over the second region of the substrate; and etching through at least one of the even horizontal layers using the mask as an etch mask structure on the stack structure without substantially etching one of the odd horizontal layers. The first method may include: forming a mask pattern on the first and second region of the substrate, the mask pattern exposing a part of the second region of the substrate; and etching through at least a pair of the plurality of horizontal layers using the mask pattern as an etch mask pattern on the stack structure. Each pair of the plurality of horizontal layers may include one of the even horizontal layers that is adjacent to one of the odd horizontal layers.

In example embodiments of inventive concepts, the performing the first process may occur before performing the first method.

In example embodiments of inventive concepts, the performing the first method may occur before performing the first process.

In example embodiments of inventive concepts, after performing the second etching process a first time, the first method may further include shrinking a planar area of the mask pattern so more of the second region of the substrate is exposed, repeating the etching through at least a pair of the plurality of horizontal layers using the shrunk mask pattern as the etch mask pattern.

In example embodiments of inventive concepts, the stack structure may include a plurality of interlayers alternately stacked in between the plurality of horizontal layers.

BRIEF DESCRIPTION OF THE DRAWINGS

The foregoing and other features and advantages of example embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating principles of inventive concepts. In the drawings.

DETAILED DESCRIPTION OF THE EMBODIMENTS

Figure 1:
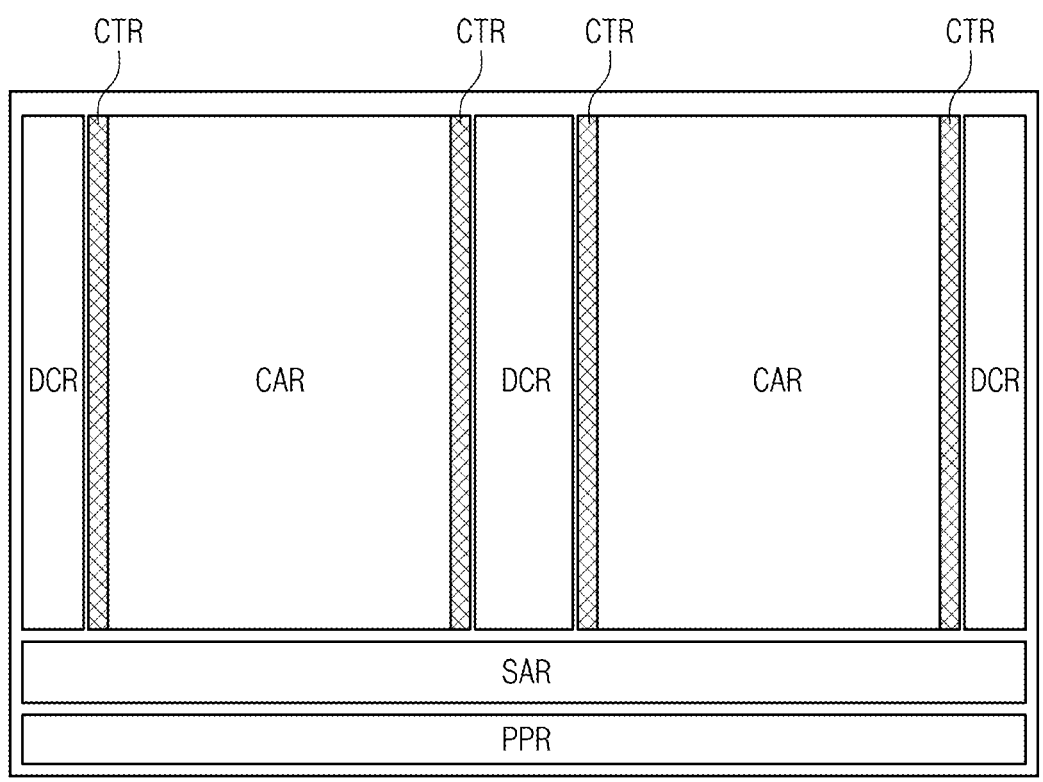
FIG. 1 is a schematic diagram illustrating a three-dimensional (3D) semiconductor device according to example embodiments of inventive concepts.

Example embodiments of inventive concepts will now be described more fully with reference to the accompanying drawings, in which some example embodiments of inventive concepts are shown. Example embodiments of inventive concepts, may, however, be embodied in many different forms and should not be construed as being limited to the embodiments set forth herein; rather, these example embodiments of inventive concepts are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

The terminology used herein is for the purpose of describing particular embodiments only and is not intended to limit example embodiments of inventive concepts. As used herein, the singular terms "a," "an" and "the" are intended to include the plural forms as well, unless the context clearly indicates otherwise.

As used herein, the term "and/or" includes any and all combinations of one or more of the associated listed items. It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent,").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of inventive concepts.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Semiconductor devices according to example embodiments have a three-dimensional (3D) structure. Semiconductor devices according to example embodiments may be memory devices.

FIG. 1 is a schematic diagram illustrating a three-dimensional (3D) semiconductor device according to example embodiments of inventive concepts.

Referring to FIG. 1, a three-dimensional (3D) semiconductor device may include a cell array region CAR, a peripheral circuit region PPR, a sense amplifier region SAR, a decoding circuit region DCR, and a contact region CTR. A plurality of memory cells, bit lines, and word lines may be disposed in the cell array region CAR. The bit lines and the word lines are provided for electrical connection of the memory cells. The word lines (e.g., horizontal electrodes) may be vertically stacked in the cell array region CAR. Circuits for driving the memory cells may be disposed in the peripheral circuit region SAR, and circuits for sensing data stored in the memory cells may be disposed in the sense amplifier region SAR. The contact region CTR may be disposed between the cell array region CAR and the decoding circuit region DCR. A wiring structure may be disposed in the contact region CTR. The wiring structure may electrically connect the word lines to the decoding circuit region DCR.

According to example embodiments of inventive concepts, the word lines (e.g., the horizontal electrodes) may extend from the cell array region CAR into the contact region CTR. The extensions of the word lines may constitute a stepped structure in the contact region CTR in order that the word lines are easily connected to circuits of the decoding circuit region DCR.

For forming a stack structure having the stepped structure in the contact region CTR, a plurality of horizontal layers may be stacked on a substrate and then a plurality of patterning processes may be performed on the horizontal layers. Each of the patterning processes may include a photolithography process and an etching process. Thus, as the number of the stacked horizontal layers increases, the number of the performed patterning processes may increase. As a result, a fabricating process of a 3D semiconductor device may be complicated and fabrication costs of the 3D semiconductor device may increase. Thus, example embodiments of inventive concepts provide fabricating methods capable of simplifying processes applied to the stacked horizontal layers.

A method of fabricating a 3D semiconductor device according to example embodiments of inventive concepts will be described in detail with reference to FIGS. 2 to 13.

Figure 2:
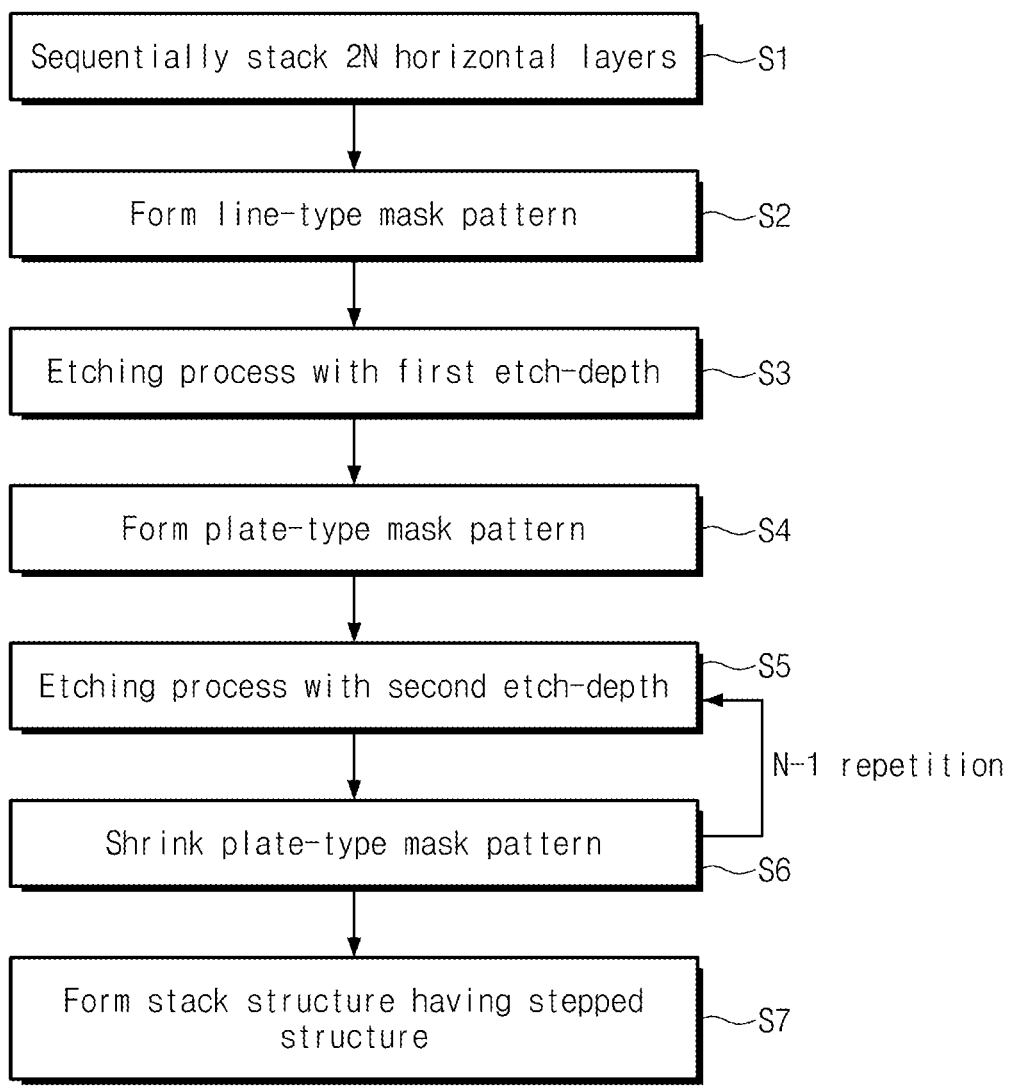
FIG. 2 is a flowchart illustrating a method of fabricating a 3D semiconductor device according to example embodiments of inventive concepts.
Figure 11:
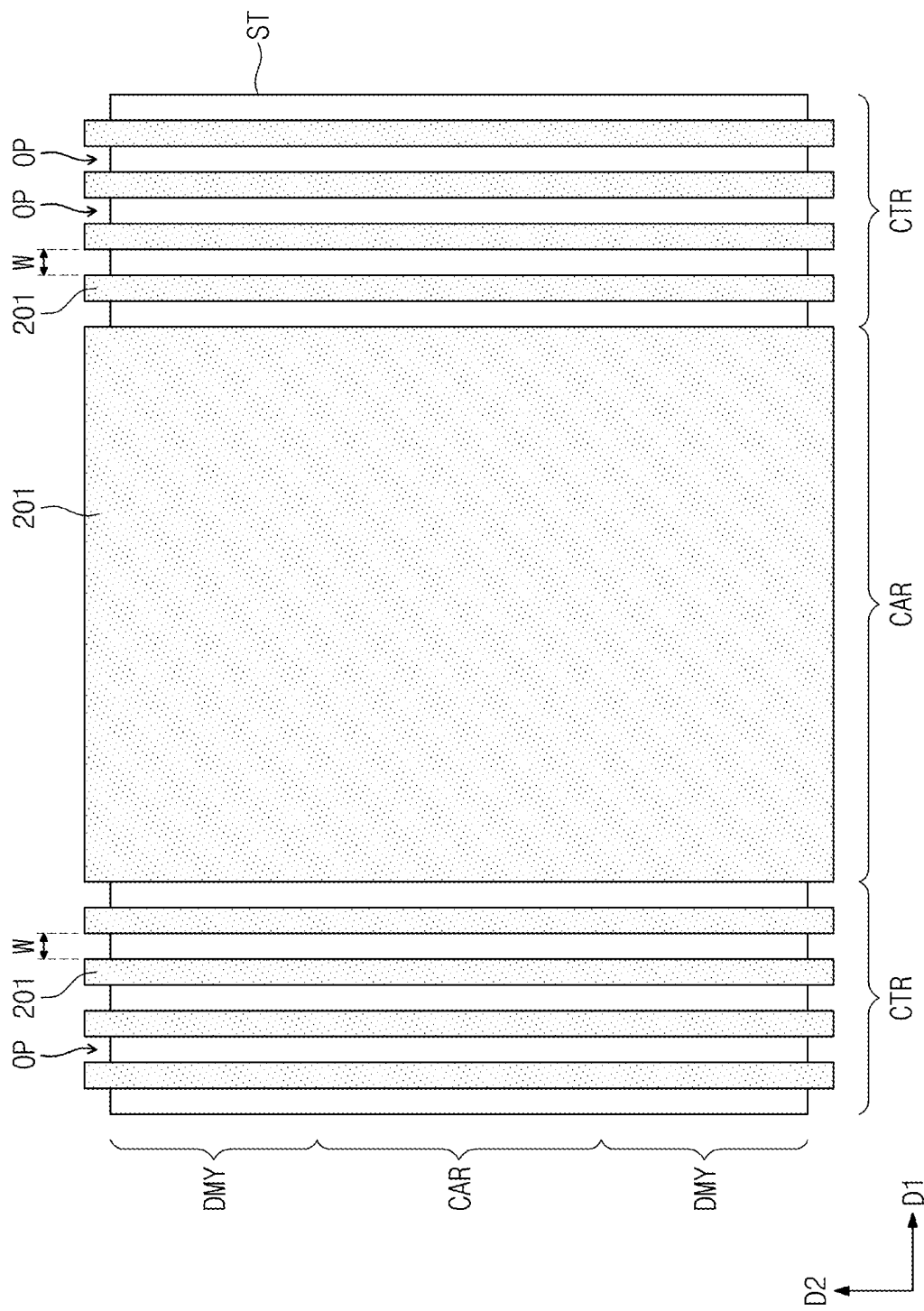
FIGS. 11 and 12 are plan views illustrating mask patterns used in a method of fabricating a 3D semiconductor device according to example embodiments of inventive concepts.
Figure 12:
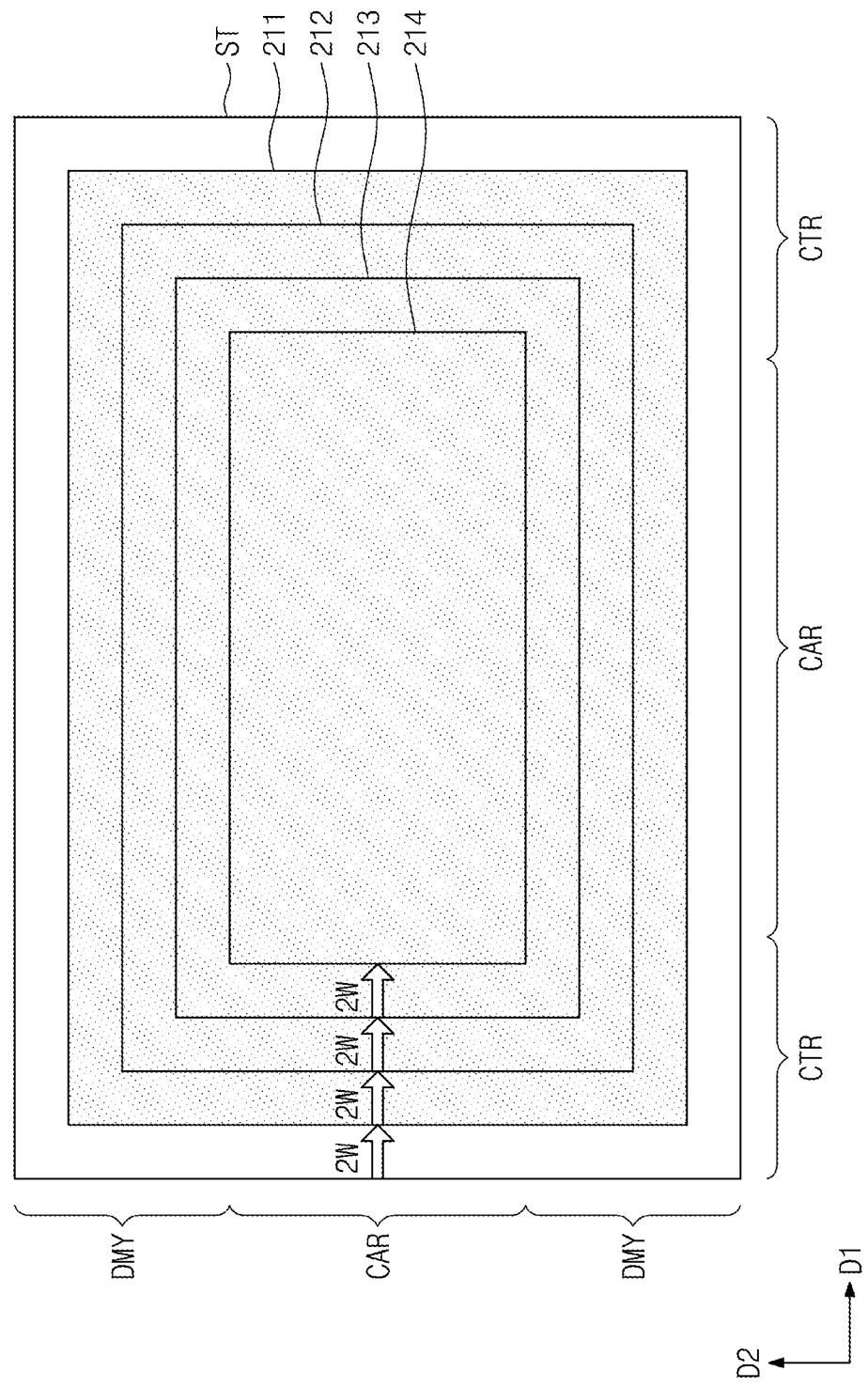
Figure 13:
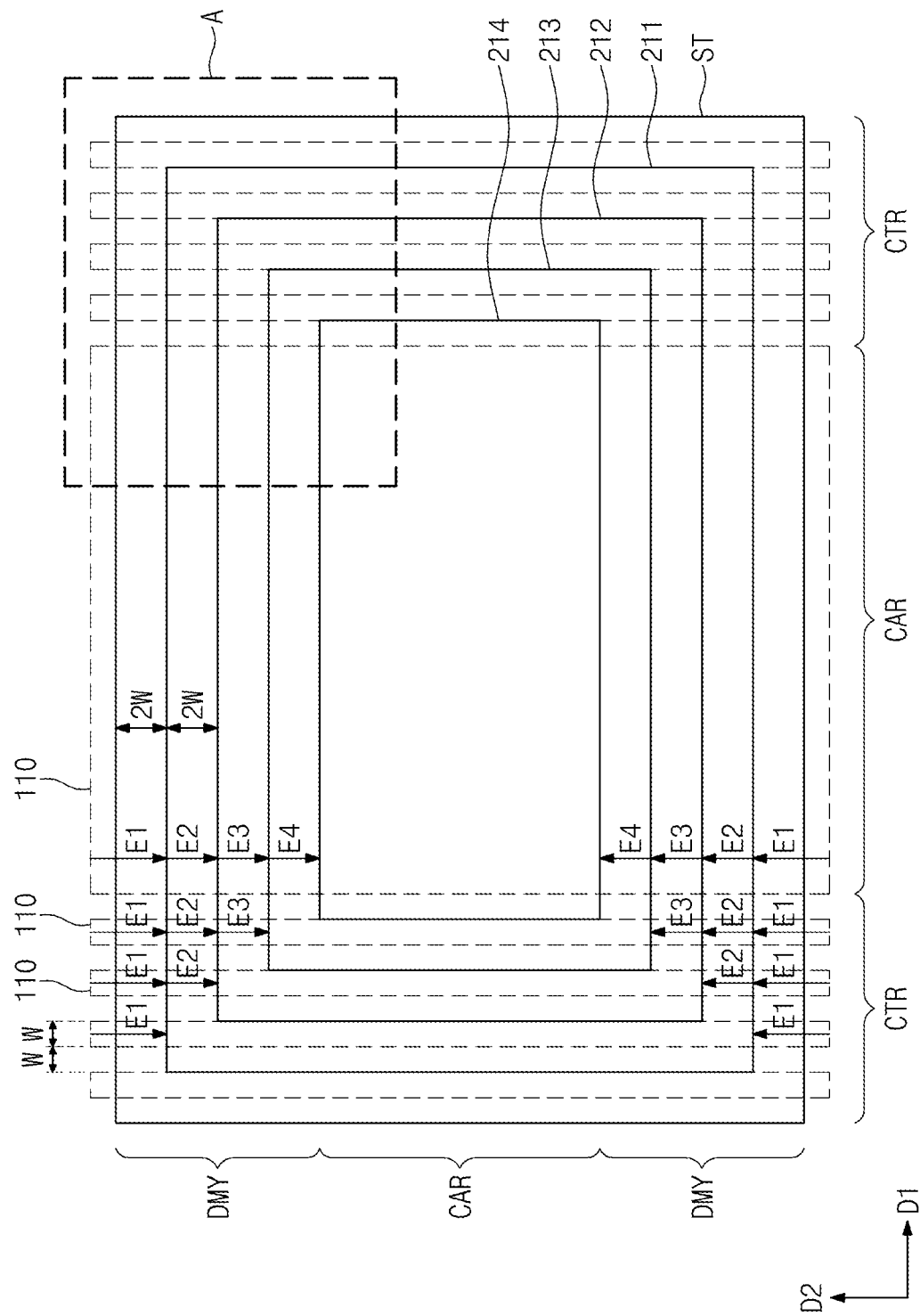
FIG. 13 is a plan view illustrating mask patterns overlapping with each other which are used in a method of fabricating a 3D semiconductor device according to example embodiments of inventive concepts.

FIG. 2 is a flowchart illustrating a method of fabricating a 3D semiconductor device according to example embodiments of inventive concepts. FIGS. 3 to 10 are cross-sectional views illustrating a method of fabricating a 3D semiconductor device according to example embodiments of inventive concepts. FIGS. 11 and 12 are plan views illustrating mask patterns used in a method of fabricating a 3D semiconductor device according to example embodiments of inventive concepts. FIG. 13 is a plan view illustrating mask patterns overlapping with each other which are used in a method of fabricating a 3D semiconductor device according to example embodiments of inventive concepts.

Referring to FIG. 2 (see also FIGS. 3 to 10), a method of fabricating a 3D semiconductor device according to example embodiments of inventive concepts may include: sequentially stacking 2N horizontal layers 100 on a substrate 10 (51), wherein N is a natural number; forming a line-type mask pattern 201 (S2); performing an etching process with a first etch-depth by using the line-type mask pattern 201 as an etch mask (S3); forming a plate-type mask pattern 211 (S4); performing an etching process with a second etch-depth 2T by using the plate-type mask pattern 211 as an etch mask (S5); shrinking the plate-type mask pattern 211 (S6); and repeatedly performing the etching process with the second depth (S5) and the process of shrinking the plate-type mask pattern 211 (S6) N−1 times to form a stack structure ST having a stepped structure (S7). The first etch-depth and the second etch-depth may be different from each other in a method of fabricating the 3D semiconductor device according to example embodiments. The fabricating method in FIG. 2 will be described in more detail hereinafter.

Figure 3:
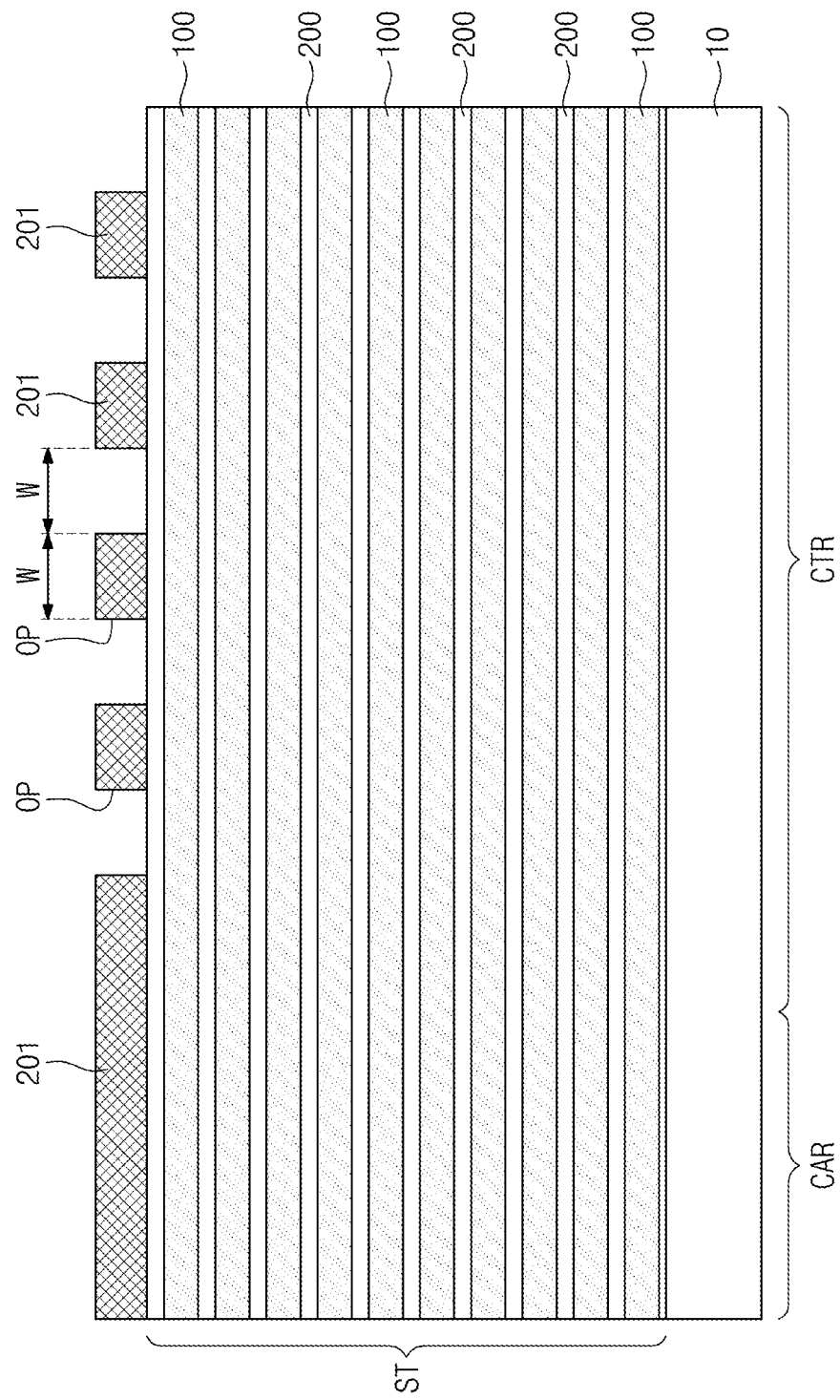
FIGS. 3 to 10 are cross-sectional views illustrating a method of fabricating a 3D semiconductor device according to example embodiments of inventive concepts.

Referring to FIGS. 2 and 3, the horizontal layers 100 and interlayer insulating layers 200 may be alternately stacked on the substrate 10 to form a stack structure ST (S1).

The substrate 10 may include a material having semiconductor properties (e.g., a silicon wafer), an insulating material (e.g., a glass), or a semiconductor or conductor covered by an insulating material. For example, the substrate 10 may be a silicon wafer having a first conductivity type. The substrate 10 may include a cell array region CAR and a contact region CTR. In more detail, as illustrated in FIGS. 11 to 13, the substrate 10 may include the cell array region CAR and the contact regions CTR respectively disposed at both sides of the cell array region CAR in a first direction D1, and the substrate 10 may include the cell array region CAR and dummy regions DMY respectively disposed at both sides of the cell array region CAR in a second direction D2. The second direction D2 may be perpendicular to the first direction D1.

The stack structure ST may include 2N horizontal layers 100, where N is a natural number. The horizontal layers 100 may be formed of a material having an etch selectivity type with respect to the interlayer insulating layers 200. For example, each of the interlayer insulating layers 200 may be a silicon oxide layer, and each of the horizontal layers 100 may include at least one of a silicon nitride layer, a silicon oxynitride layer, a poly-silicon layer, a metal layer, or metal layers. In example embodiments of inventive concepts, the horizontal layers 100 may be formed of the same material.

Referring to FIGS. 2, 3, and 11, the line-type mask pattern 201 may be formed on the stack structure ST (S2).

As illustrated in FIG. 11, the line-type mask pattern 201 may cover the cell array region CAR and may have a line and space shape in the contact region CTR. Additionally, the line-type mask pattern 201 may cover the dummy region DMY adjacent to the cell array region CAR.

In more detail, the line-type mask pattern 201 may have openings OP extending in the second direction D2 in the contact region CTR. The openings OP may expose portions of the stack structure ST, respectively. Additionally, the line-type mask pattern 201 may include line patterns in the contact region CTR. In example embodiments of inventive concepts, when the number of the stacked horizontal layers 100 is 2N (where N is a natural number), the number of the line patterns of the line-type mask pattern 201 in the contact region CTR may be N−1. In example embodiments of inventive concepts, a width W of the line pattern of the line-type mask pattern 201 may be substantially equal to a width W of the opening OP of the line-type mask pattern 201.

Figure 4:
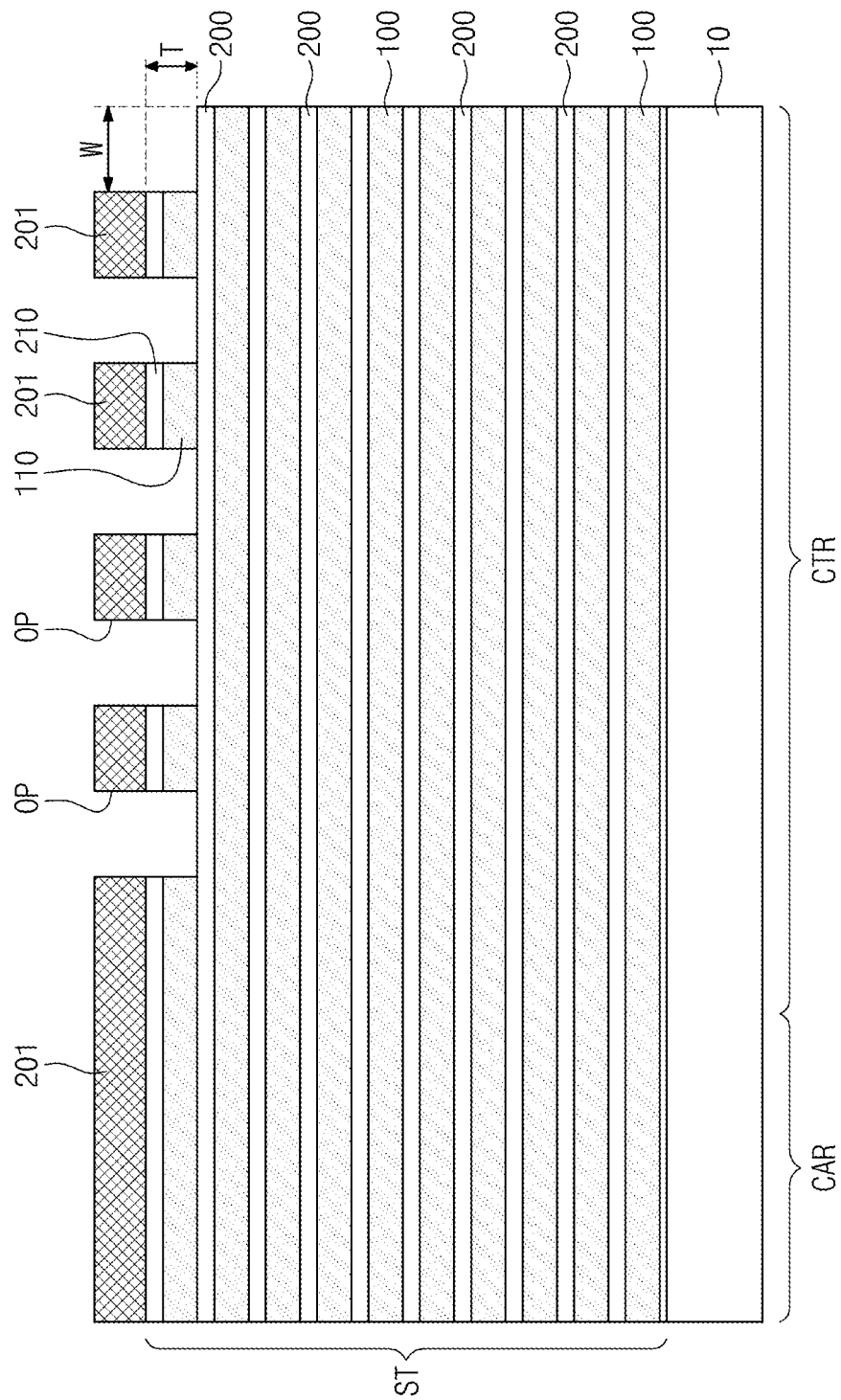

Referring to FIGS. 2 and 4, a first etching process may be performed using the line-type mask pattern 201 as an etch mask on the stack structure ST (S3).

The stack structure ST may be anisotropically etched a first etch-depth during the first etching process. The first etch-depth may correspond to a vertical pitch T between the horizontal layers 100 vertically adjacent to each other. After the first etching process is performed, the line-type mask pattern 201 may be removed.

During the first etching process, an uppermost horizontal layer 100 and an uppermost interlayer insulating layer 200 may be patterned. In other words, linear horizontal patterns 110 and linear insulating patterns 210 may be formed at an uppermost layer of the stack structure ST in the contact region CTR. In example embodiments of inventive concepts, an outermost horizontal pattern 110 may be disposed at a position spaced apart from an outer sidewall of the stack structure ST by a first horizontal distance W corresponding to a width of the horizontal pattern 110.

Figure 5:
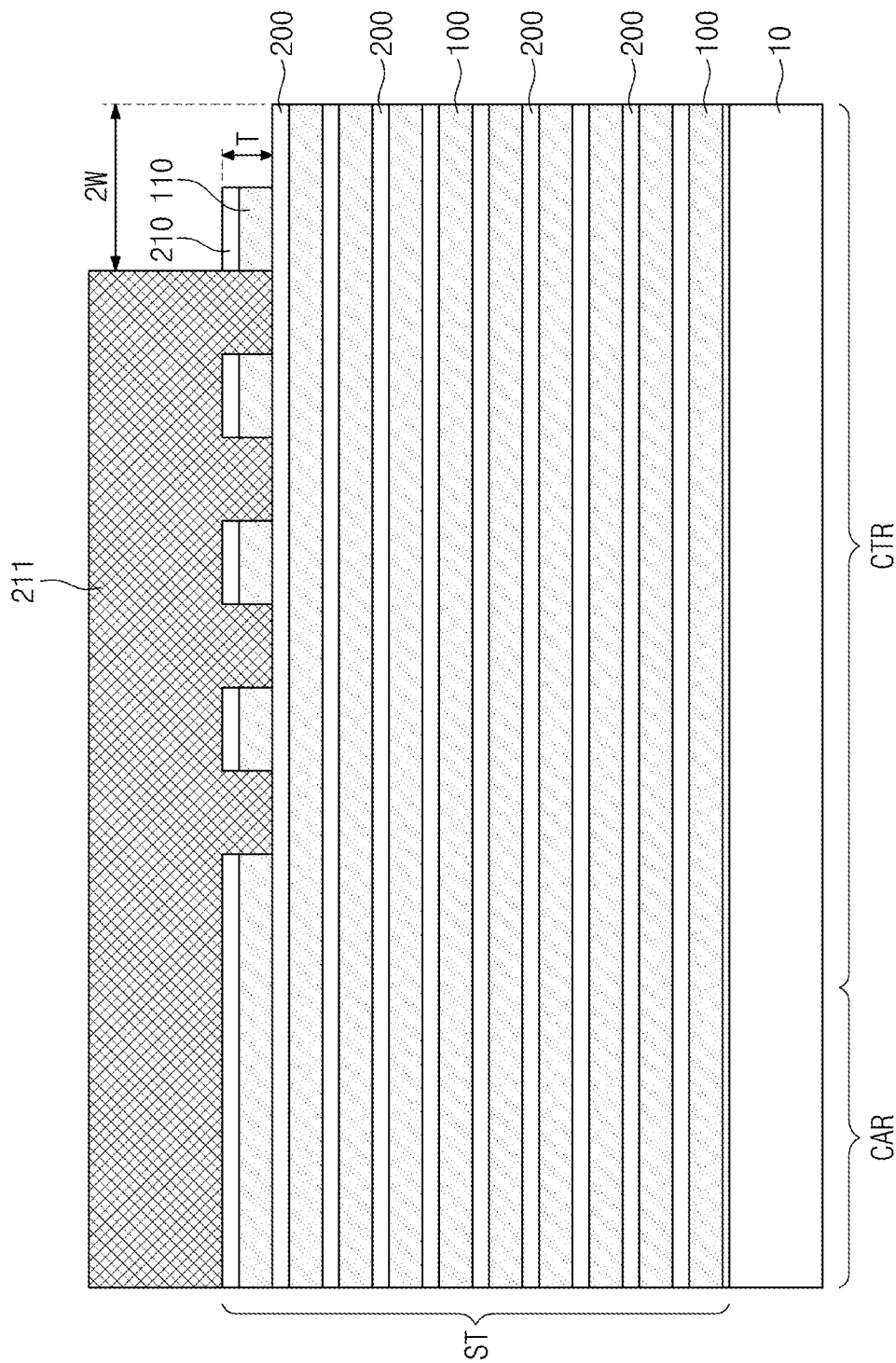

Referring to FIGS. 2 and 5, the plate-type mask pattern 211 may be formed on the stack structure ST having the horizontal patterns 110 disposed at the uppermost layer thereof (S4).

The plate-type mask pattern 211 may have a plate shape covering the cell array region CAR and a part of the contact region CTR, as illustrated in FIG. 12. Additionally, the plate-type mask pattern 211 may cover a part of the dummy region DMY.

In more detail, the plate-type mask pattern 211 may not cover a top surface of the outermost horizontal pattern of the horizontal patterns 110. In other words, the plate-type pattern 211 may expose a top surface of the insulating pattern 210 farthest from the cell array region CAR. In example embodiments of inventive concepts, a sidewall of the plate-type mask pattern 211 may be spaced apart from the outer sidewall of the stack structure ST by a second horizontal distance 2 W. The second horizontal distance 2 W may be twice the width W of the horizontal pattern 110. In example embodiments of inventive concepts, the portion of the stack structure, which is exposed by the plate-type mask pattern 211, may have a vertical height difference corresponding to the vertical pitch T of the horizontal layers 100.

Figure 6:
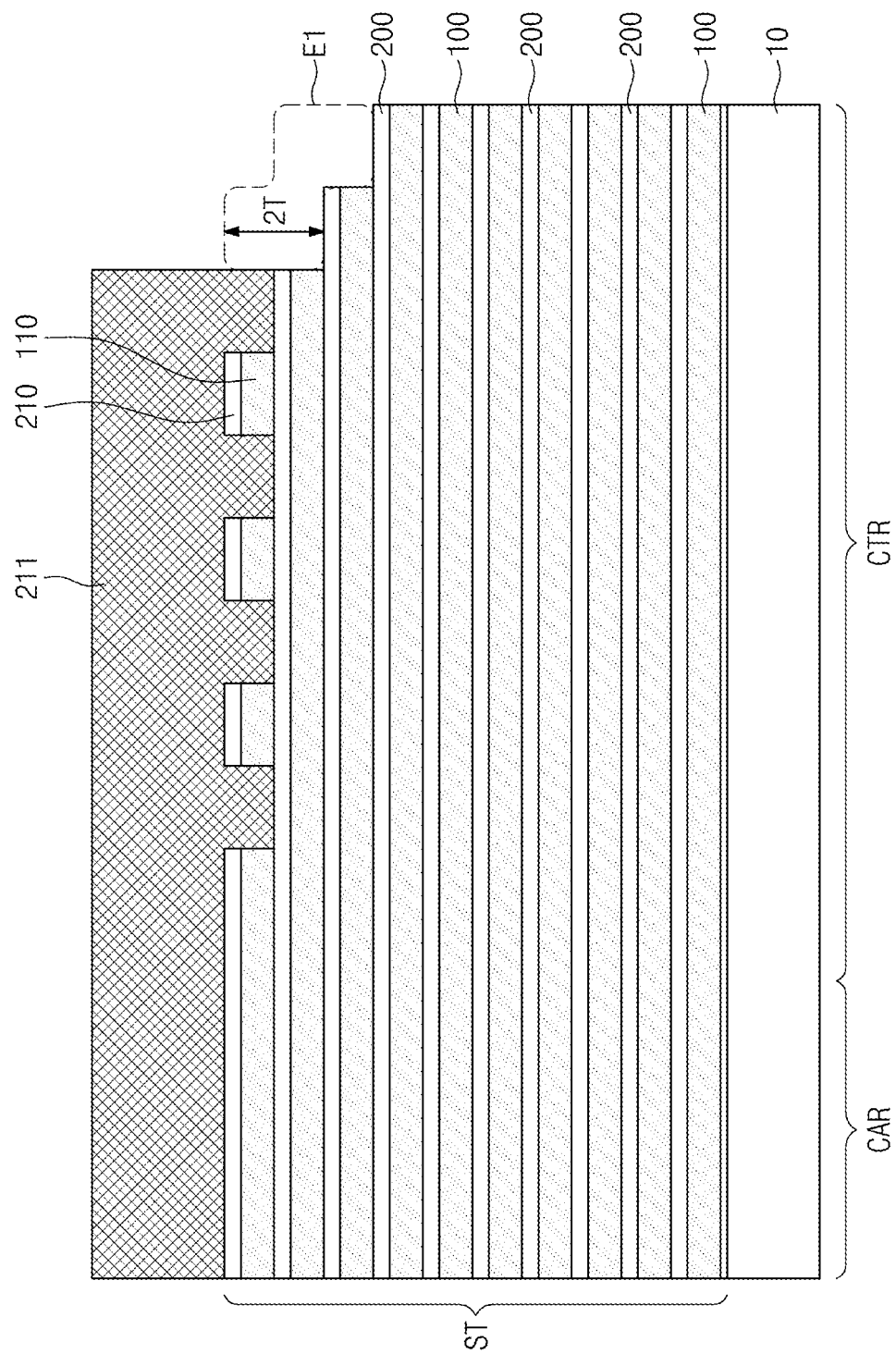

Referring to FIGS. 2 and 6, a second etching process may be performed using the plate-type mask pattern 211 as an etch mask on the stack structure ST (S5).

The horizontal layers 100 and the interlayer insulating layers 200 may be anisotropically etched using the plate-type mask pattern 211 as an etch mask during the second etching process. The stack structure ST exposed by the plate-type mask pattern 211 may be anisotropically etched by the second etch-depth 2T. In example embodiments of inventive concepts, the second etch-depth 2T of the second etching process may be greater than the first etch-depth of the first etching process. One of the horizontal patterns 110 at the uppermost layer and one of the insulating patterns 210 at the uppermost layer may be removed by the second etching process. In example embodiments of inventive concepts, the second etch-depth 2T may correspond to twice the vertical pitch T of the stacked horizontal layers 100. In other words, two layers of the horizontal layers 100 and two layers of the interlayer insulating layers 200 may be anisotropically etched by the second etching process.

In example embodiments of inventive concepts, since the horizontal patterns 110 may be disposed at the uppermost layer of the stack structure ST in the contact region CTR, the portion of the stack structure ST, which is exposed by the plate-type mask pattern 211, may have the height difference. Thus, a vertical height of the portion of the stack structure ST may be reduced by twice the vertical pitch T between the horizontal layers 100 through the second etching process, and the height difference T of the stack structure may be maintained under a region where the second etching process is performed (e.g., an etched region E1). In other words, the stack structure ST under the etched region E1 of the second depth 2T may have the height difference corresponding to the vertical pitch T of the horizontal layers 100.

Figure 7:
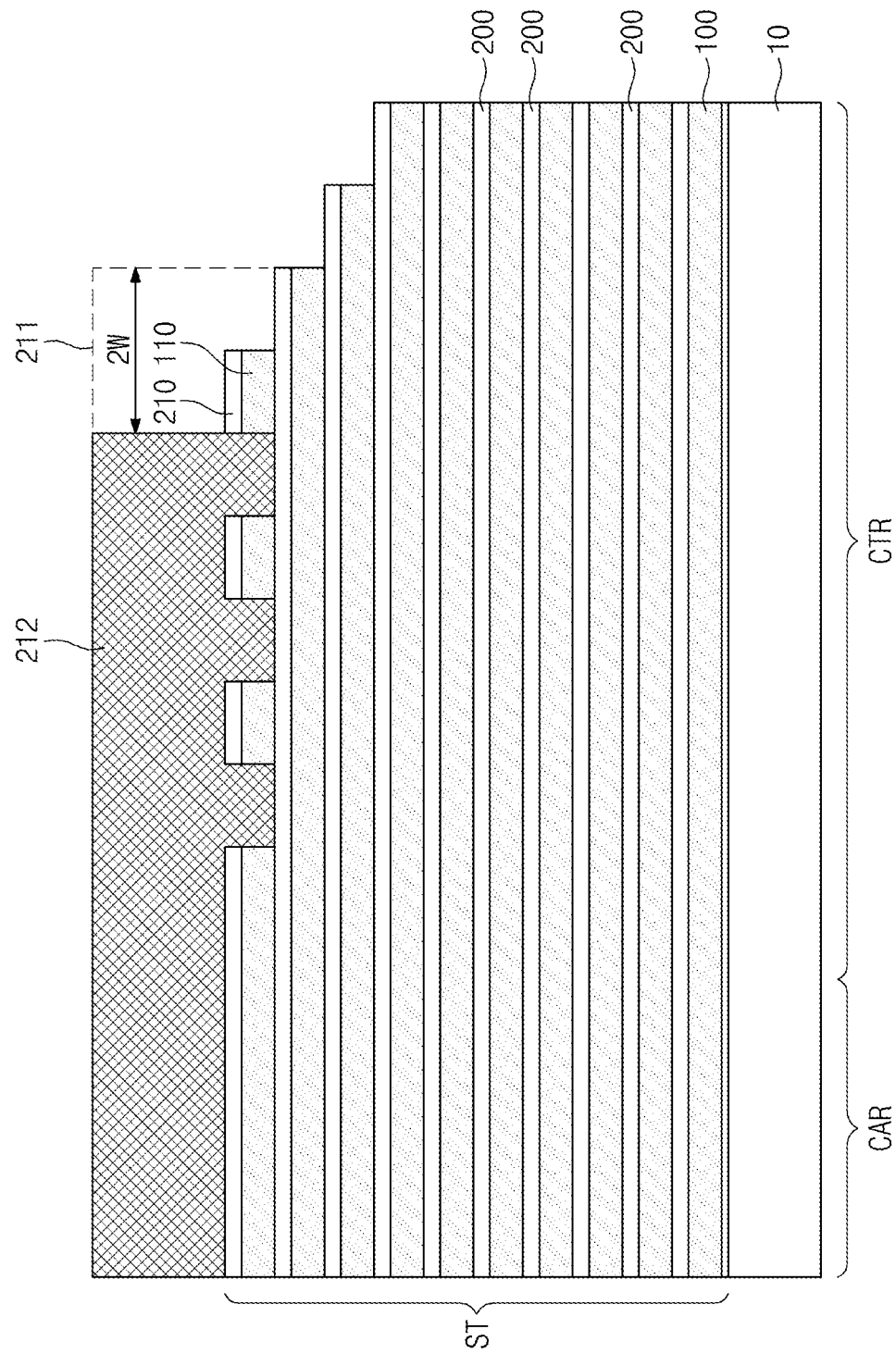

Referring to FIGS. 2, 7, and 12, after the second etching process is performed, the process of shrinking a planar area of the plate-type mask pattern 211 may be performed (S6). The sidewall of the plate-type mask pattern 211 may be laterally etched by the process of shrinking the plate-type mask pattern 211. Thus, an area of the stack structure ST, which is exposed by the plate-type mask pattern 211, may increase. In example embodiments of inventive concepts, the sidewall of plate-type mask pattern 211 may be laterally etched by twice the width W of the horizontal pattern 110 through the process of shrinking the plate-type mask pattern 211.

The process of shrinking the plate-type mask pattern 211 may use an isotropic dry etching process or a wet etching process. Accordingly, a thickness of the plate-type mask pattern 211 may be reduced as well as the area of the plate-type mask pattern 211. A portion of the plate-type mask pattern 211 may remain on the stack structure ST until patterning processes are performed from a lowermost horizontal layer 100 to the uppermost horizontal layer 100. In example embodiments of inventive concepts, since the mask pattern may be shrunk to be reused, technical difficulties caused by mask misalignment may be reduced or minimized when the patterning processes are repeatedly performed on the stack structure ST.

As described above, the plate-type mask pattern 211 may be shrunk to form a first sub-mask pattern 212 on the stack structure ST. The first sub-mask pattern 212 may expose the insulating pattern 210 on an outermost one of the horizontal patterns 110 covered by plate-type mask pattern 211. In other words, the first sub-mask pattern 212 may not cover the outermost one of the horizontal patterns 110 covered by plate-type mask pattern 211. A portion of the stack structure ST, which is exposed by the first sub-mask pattern 212, may have a stepped structure that has sidewalls of the horizontal layers 100 arranged at intervals of the width of the horizontal pattern 110 from the sidewall of the first sub-mask patterns. A vertical height of the stepped structure may be reduced stepwise by the vertical pitch T of the horizontal layers 100 on each step.

Figure 8:
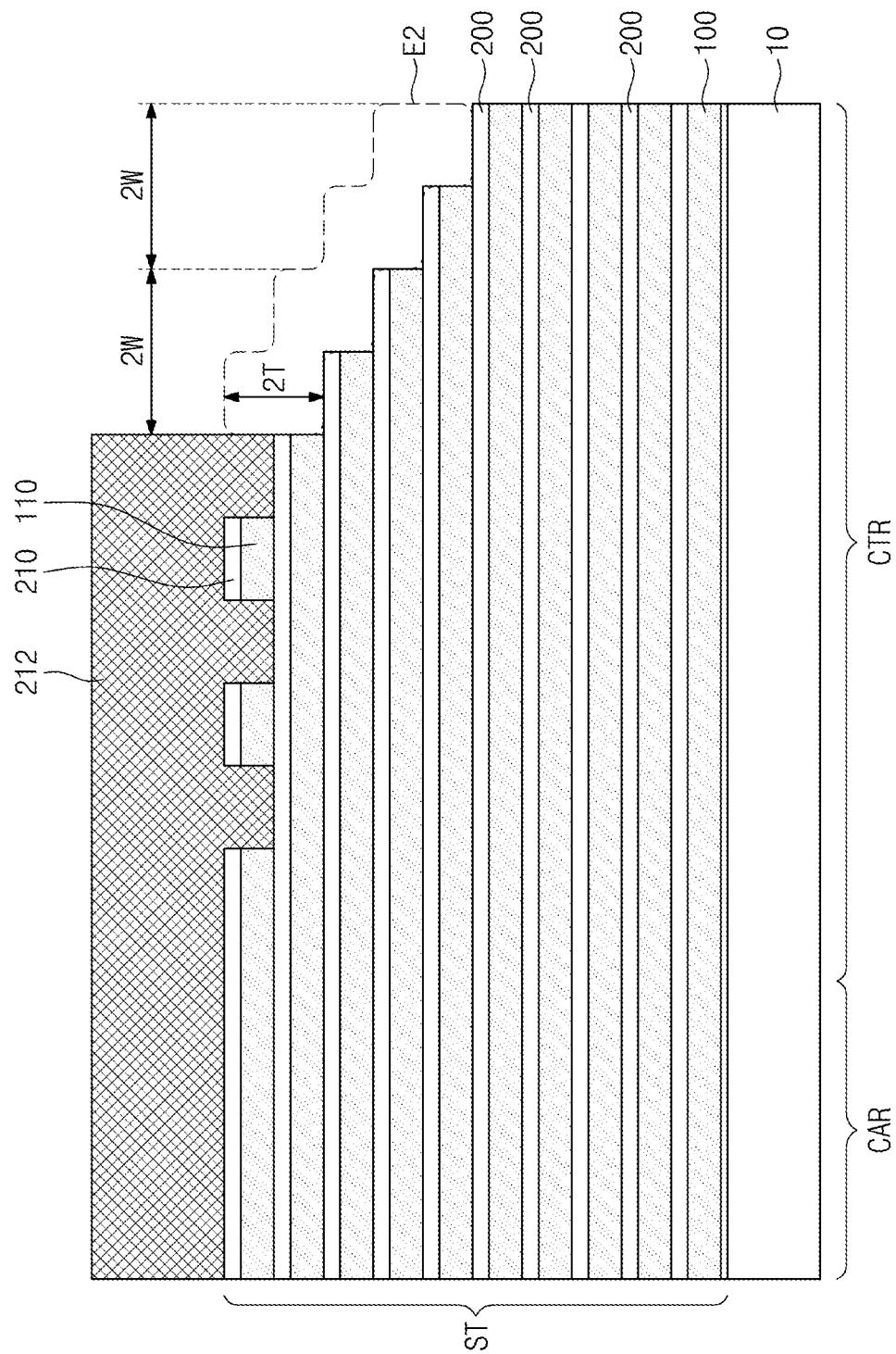

Referring to FIG. 8, the second etching process described with reference to FIG. 6 may be performed using the first sub-mask pattern 212 as an etch mask. The second etching process is performed using the first sub-mask pattern 212, so that the uppermost horizontal pattern 110 and the uppermost insulating pattern 210 may be removed and the vertical height of the stack structure ST exposed by the first sub-mask pattern 212 may be reduced.

The height of the portion of the stack structure ST exposed by the first sub-mask pattern 212 may be reduced by the second etch-depth 2T. A horizontal distance between sidewalls of the horizontal layers 100 may be substantially equal to the width of the horizontal pattern 110 under a region E2 etched using the first sub-mask pattern 212. The height of the stack structure ST under the etched region E2 may be regularly reduced by the vertical pitch T of the horizontal layers 100. As described with reference to FIG. 6, the vertical height of the portion of the stack structure ST may be reduced by twice the vertical pitch T of the horizontal layers 100, and the etched portion of the stack structure ST may have height differences, of which each corresponds to the vertical pitch T. Additionally, the interlayer insulating layers 200 on portions of two horizontal layers 100 covered in the previous process may be exposed at the same time.

Figure 9:
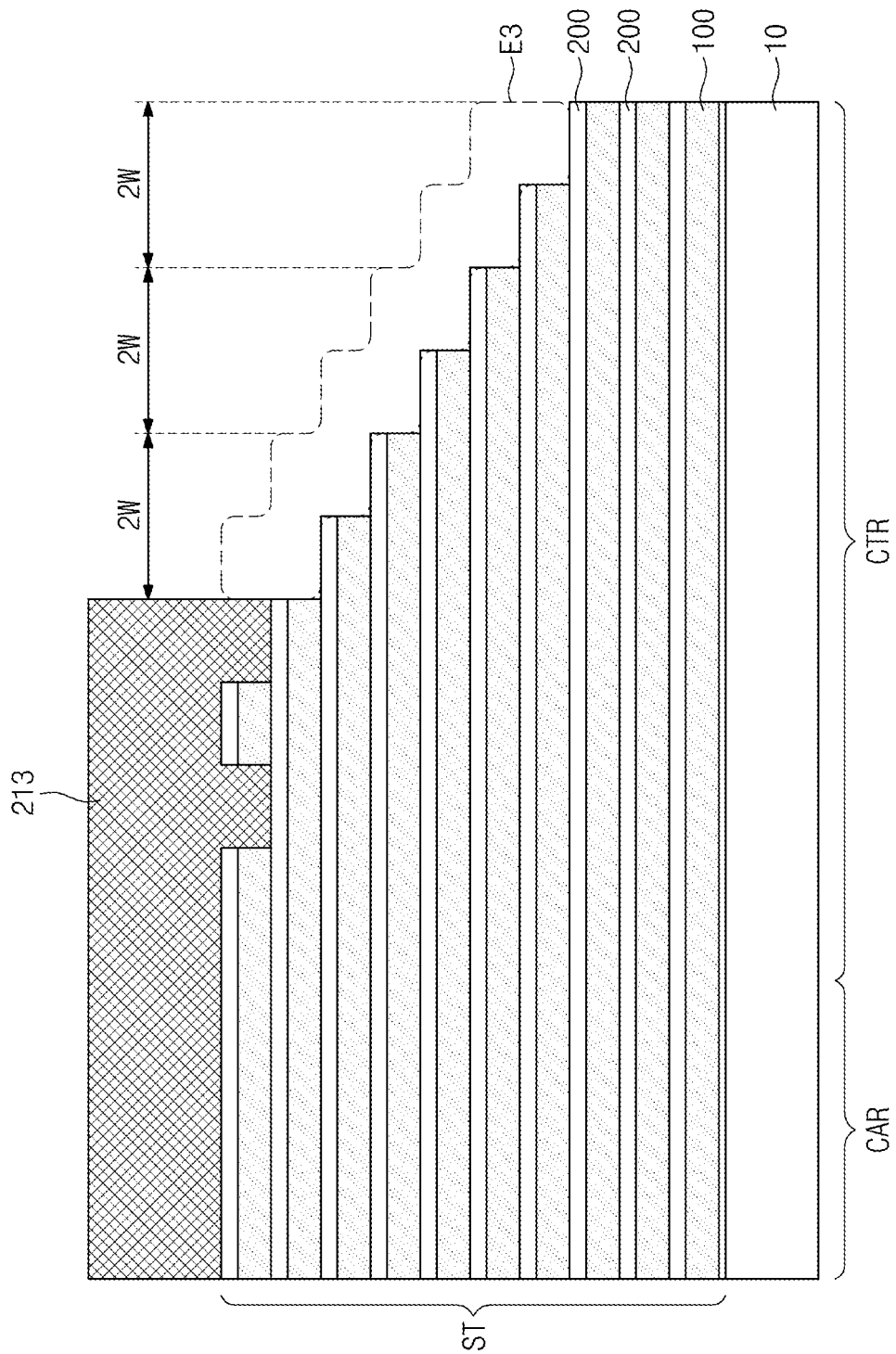

Referring to FIG. 9, as mentioned with reference to FIG. 7, the first sub-mask pattern 212 may be shrunk to form a second sub-mask pattern 213. Thereafter, the second etching process may be re-performed using the second sub-mask pattern 213 as an etch mask on the stack structure ST. In other words, the stack structure ST exposed by the second sub-mask pattern 213 may be etched by the second etch-depth, along with one horizontal pattern 110 and one insulating pattern 210. Thus, two horizontal layers 100 covered in the previous second etching process may be anisotropically etched. The process of shrinking the plate-type mask pattern 211 and the second etching process are repeatedly performed, so that an area of an etched region E3 may increase.

Figure 10:
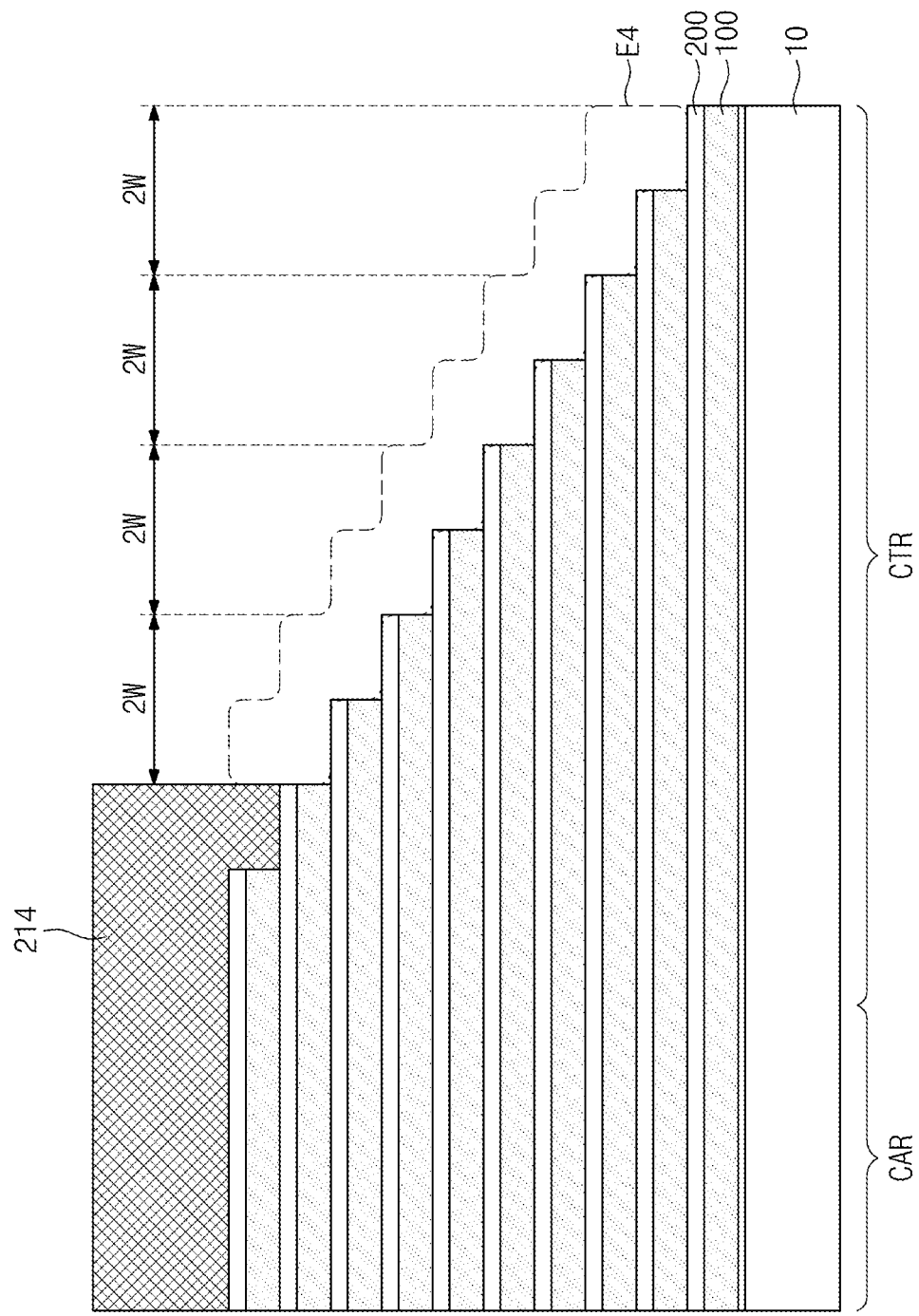

Referring to FIGS. 2 and 10, the shrinking process may be performed on the second sub-mask pattern 213, thereby forming a third sub-mask pattern 214. The second sub-mask pattern 214 may expose the closest horizontal pattern 110 and the closest insulating pattern 210 to the cell array region CAR.

The second etching process is performed using the third sub-mask pattern 214, so that all of the horizontal patterns 110 disposed at the uppermost layer of the stack structure St may be removed. In other words, the second etching process may be performed N−1 times, so that all of the horizontal patterns 110 may be removed. The second etching process using the third sub-mask pattern 214 may have an etched region E4 reducing a height of the stack structure ST exposed by the third sub-mask pattern 214 by twice the vertical pitch T of the horizontal layers 100. The height of the stack structure ST under the etched region E4 may be reduced stepwise by the vertical pitch T on each step.

In example embodiments of inventive concepts, after the second etching process is performed N−1 times, the third sub-mask pattern 214 may be removed from the stack structure ST. Thus, the stack structure ST may be formed to have a stepped structure in the contact region CTR (S7).

In more detail, sidewalls of the horizontal layers 100 may be arranged at intervals of the first horizontal distance W in the contact region CTR, and the vertical height of the stack structure ST may be reduced stepwise by the vertical pitch T on each step in the contact region CTR as a distance from the cell array region CAR increases. Thus, the stepped structure may be realized in the contact region CTR.

In a method according to example embodiments of inventive concepts, the first etching process may be performed using the line-type mask pattern 201 on the uppermost horizontal layer 10, thereby forming the horizontal patterns 110. Thereafter, the process of shrinking the plate-type mask pattern 211 and the second etching process may be repeatedly performed on the stack structure ST including the horizontal patterns 110. Here, the sidewall of the shrunk plate-type mask pattern may be laterally etched toward the cell array region CAR by the second horizontal distance 2W corresponding to twice the width W of the horizontal pattern 110 before each of the second etching processes. Thus, photolithography processes and etching processes corresponding to the number (e.g., 2N) of the stacked horizontal layers 100 are not performed. In other words, in a method according example embodiments of inventive concepts, two photolithography processes and N times etching processes may be performed to form the stack structure ST having the stepped structure. That is, the stack structure ST formed by the first etching process and a plurality of the second etching process may have the height reduced stepwise by the vertical pitch T on each step as a distance from the cell array region CAR increases stepwise by the width of the horizontal pattern 110 on each step.

Meanwhile, the plate-type mask pattern 211 may expose portions of the stack structure ST in the contact region CTR and the dummy region DMY, as illustrated in FIGS. 12 and 13.

Referring to FIG. 13, the plate-type mask pattern 211 may expose the outermost horizontal pattern 110 in the contact region CTR and may expose portions of the horizontal patterns 110 in the dummy region DMY at the same time.

Thus, the outermost horizontal pattern 110 may be removed and long axis lengths (e.g., lengths in the second direction D2) of the remaining horizontal patterns 110 may be reduced by the second etching process using the plate-type mask pattern 211. As a result, the number of the horizontal patterns 110 remaining at the uppermost layer may be reduced and the long axis lengths of the remaining horizontal patterns 110 may be progressively reduced as the process of shrinking the plate-type mask pattern 211 and the second etching process may be repeatedly performed. The long axis length of the remaining horizontal pattern 110 may be reduced by quadruple the width of the horizontal pattern 110 by each of the second etching process. In other words, as a distance between a sidewall of the stack structure ST and the cell array region CAR is increased stepwise by 2 W on each step in the dummy region DMY, a height of the stack structure ST may be reduced stepwise by twice the vertical pitch T of the stacked horizontal layers 100 on each step.

Figure 24:
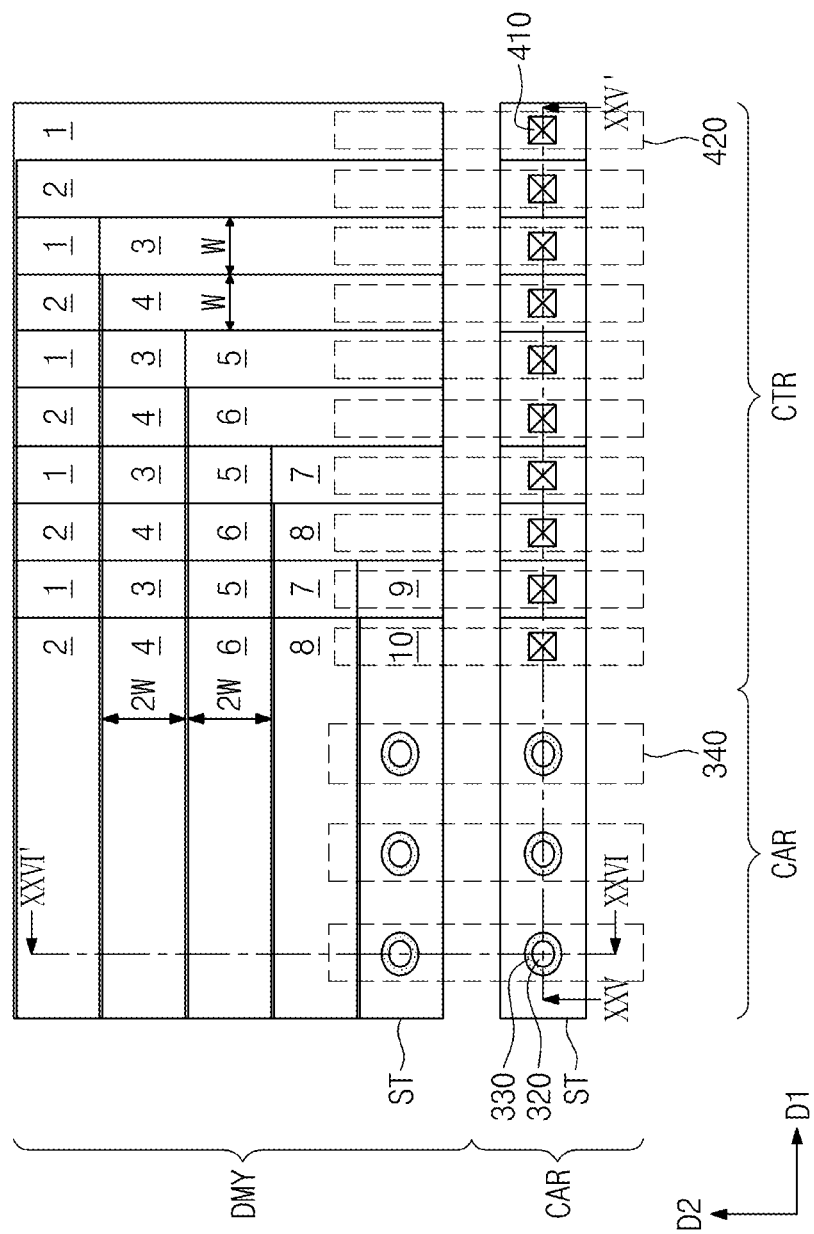
FIG. 24 is a plan view of a portion 'A' of FIG. 13 to illustrate a portion of a 3D semiconductor device formed using a method of fabricating a 3D semiconductor device according to example embodiments of inventive concepts.

Additionally, the stack structure ST may have a concavo-convex structure in an overlapping area of the contact region CTR and the dummy region DMY by the horizontal patterns 110 and the repeated second etching processes. In more detail, referring to FIG. 24, end portions of even-numbered horizontal layers 100 may be exposed in the dummy region DMY. End portions of odd-numbered horizontal layers 100 may be disposed under the end portions of the even-numbered horizontal layers 100 in the dummy region DMY. Portions of the odd-numbered horizontal layers 100 may be exposed in the overlapping region of the contact region CTR and the dummy region DMY. In other words, portions of the even-numbered horizontal layers 100 and the portions of the odd-numbered horizontal layers 100 may be alternately exposed in the overlapping region of the contact region CTR and the dummy region DMY. In FIG. 24, each of numerals illustrated in the overlapping region of the contact region CTR and the dummy region DMY indicates a layer number of each of horizontal layers 100 shown in a plan view.

The stack structure ST described above may be applied to a 3D semiconductor memory device, and the horizontal layers 100 may be used as horizontal electrodes. In this case, after the stack structure ST having the stepped structure, a wiring structure may be formed to be connected to the horizontal layers 100. The wiring structure may include contact plugs and wires which are connected to the horizontal layers 100, respectively.

Figure 14:
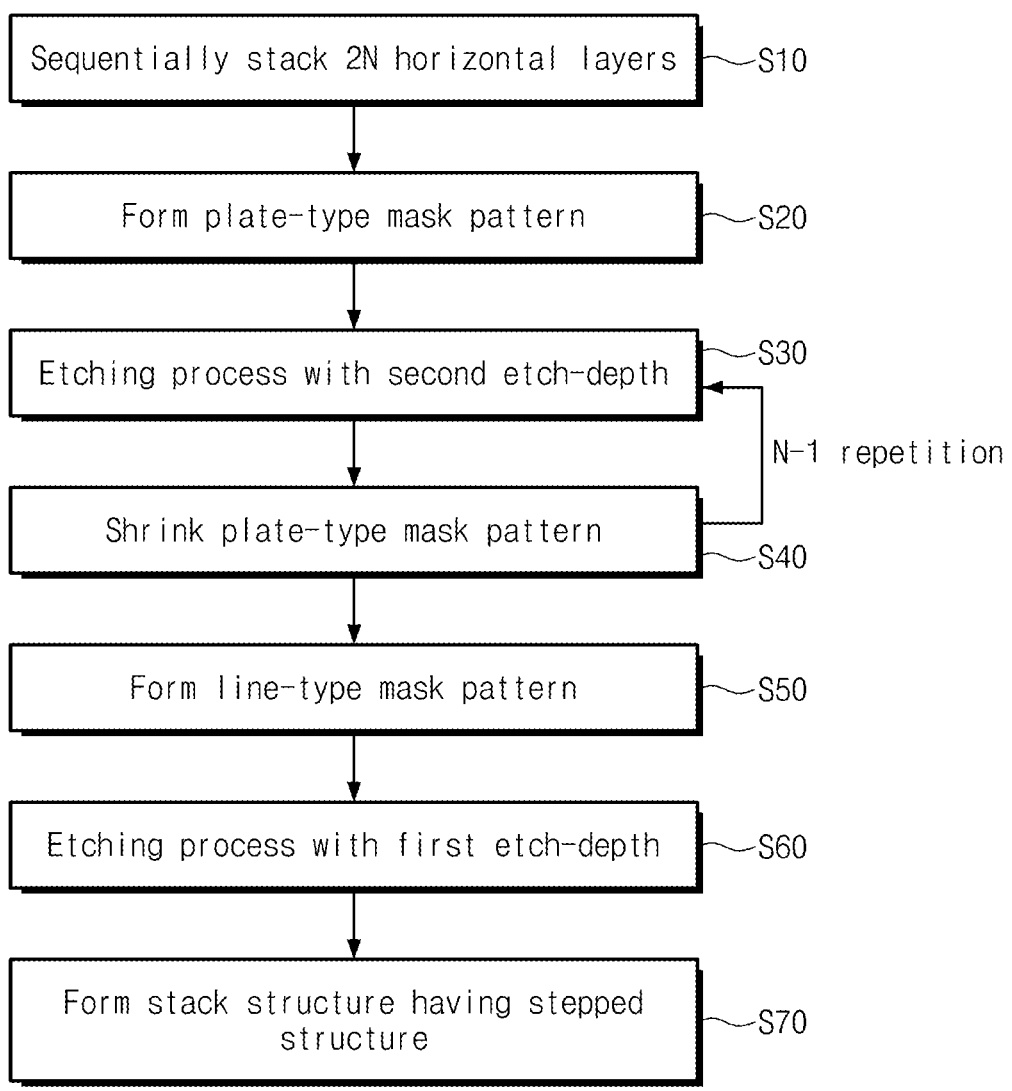
FIG. 14 is a flowchart illustrating a method of fabricating a 3D semiconductor device according to example embodiments of inventive concepts.
Figure 22:
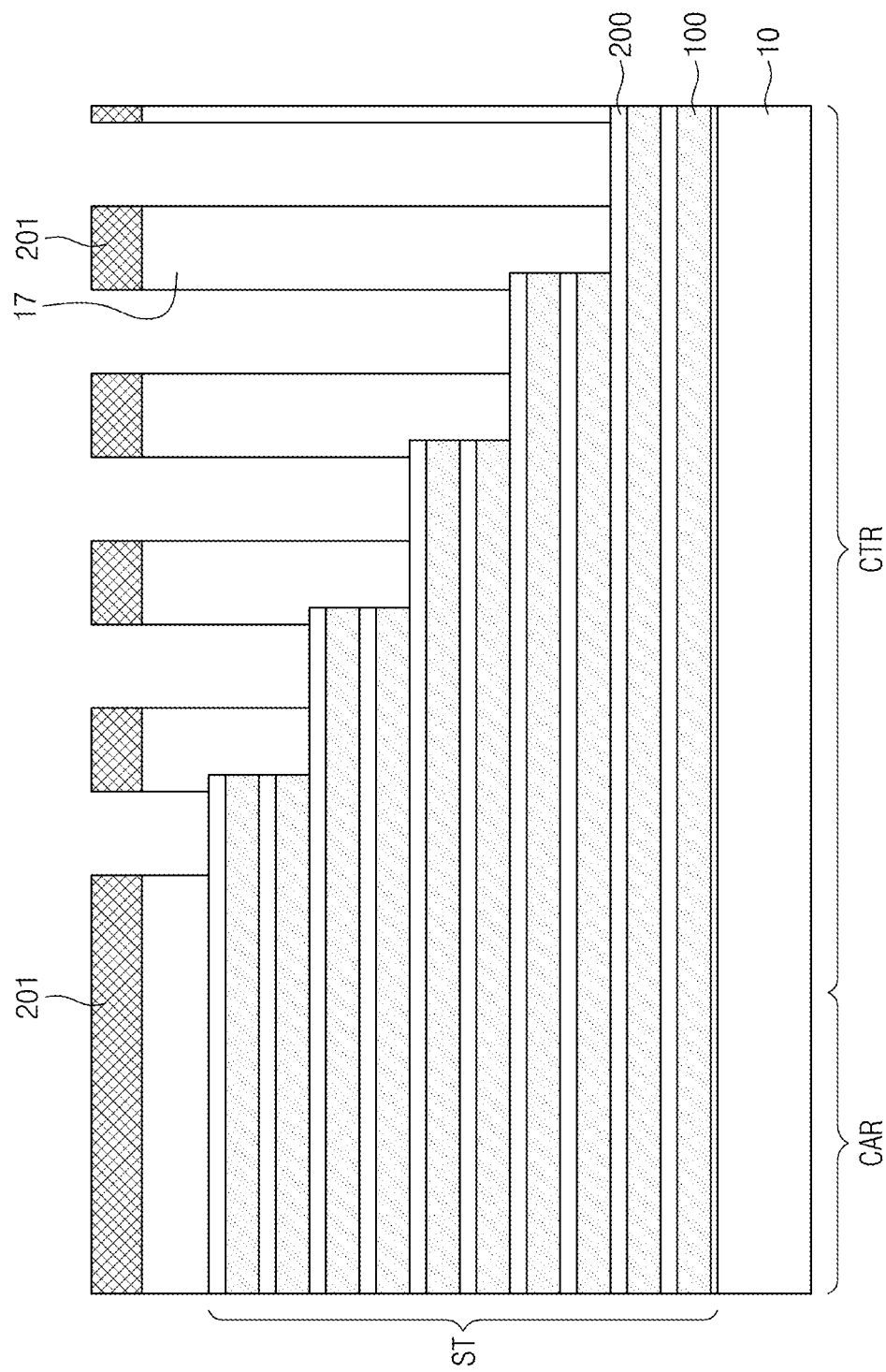
FIGS. 22 and 23 are cross-sectional views illustrating a modified example of a method of fabricating a 3D semiconductor device according to example embodiments of inventive concepts.
Figure 23:
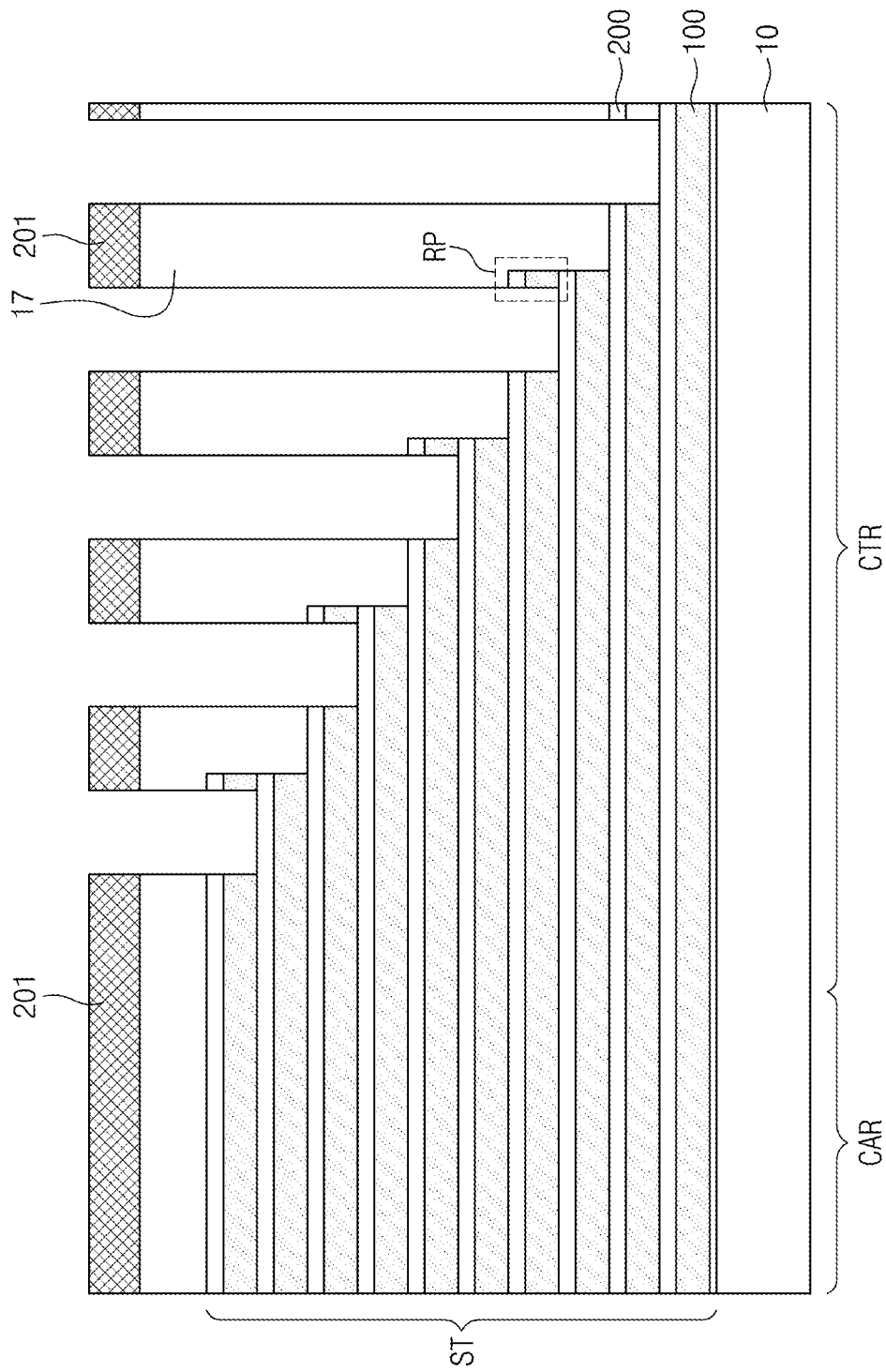

FIG. 14 is a flowchart illustrating a method of fabricating a 3D semiconductor device according to embodiments of inventive concepts. FIGS. 15 to 21 are cross-sectional views illustrating a method of fabricating a 3D semiconductor device according to embodiments of inventive concepts. FIGS. 22 and 23 are cross-sectional views illustrating a method of fabricating a 3D semiconductor device according to embodiments of inventive concepts.

Referring to FIG. 14, a method of fabricating a 3D semiconductor device according to example embodiments of inventive concepts may include: sequentially stacking 2N horizontal layers 100 on a substrate 10 (S10), where N is a natural number; forming a plate-type mask pattern 211 (S20); repeatedly performing an etching process with a second etch-depth by using the plate-type mask pattern 211 as an etch mask (S30) and a process of shrinking the plate-type mask pattern 211 (S40) N−1 times; forming a line-type mask pattern 201 (S50); performing an etching process with a first etch-depth by using the line-type mask pattern 201 as an etch mask (S60) to form a stack structure ST having a stepped structure (S70). The first etch-depth and the second etch-depth may be different from each other. In a method according to example embodiments of inventive concepts, after the etching process using the plate-type mask pattern 211 is performed N−1 times, the etching process using the line-type mask pattern 201 may be performed, unlike the method according to example embodiments discussed above with reference to FIGS. 2-13.

Figure 15:
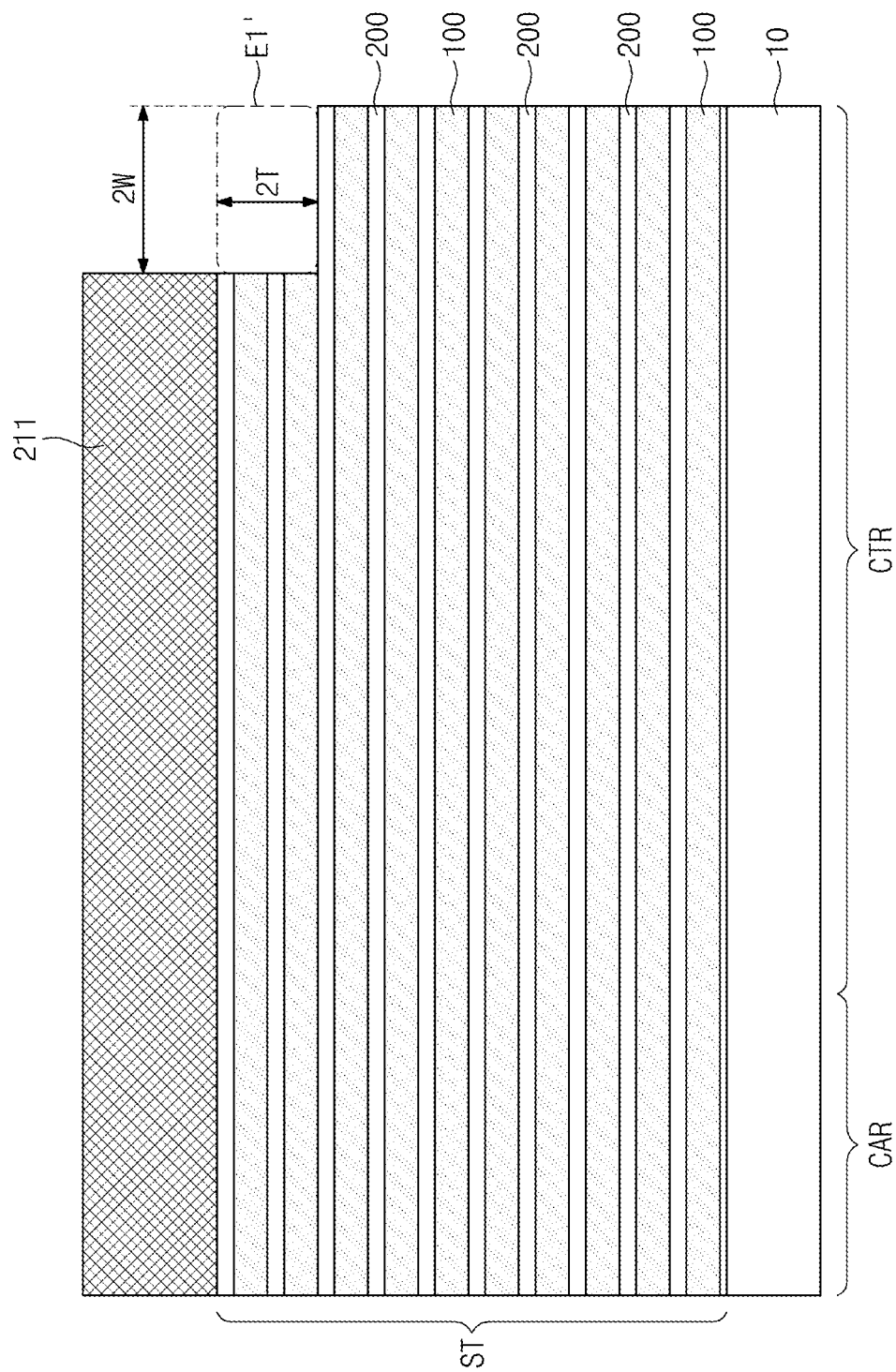
FIGS. 15 to 21 are cross-sectional views illustrating a method of fabricating a 3D semiconductor device according to example embodiments of inventive concepts.

Referring to FIGS. 14 and 15, the horizontal layers 100 and the interlayer insulating layers 200 may be alternately stacked on the substrate 10 to form the stack structure ST, as described with reference to FIG. 3 (S10). The stack structure ST may include 2N horizontal layers 100, where N is a natural number.

Next, the plate-type mask pattern 211 is formed on the stack structure ST (S20). The plate-type mask pattern 211 may be the same as the plate-type mask pattern 211 described with reference to FIGS. 5 and 12. In other words, the plate-type mask pattern 211 may expose parts of the contact region CTR and the dummy region DMY and may cover the cell array region CAR, as illustrated in FIG. 12. Additionally, the plate-type mask pattern 211 may expose a part of the dummy region DMY. In example embodiments of inventive concepts, a sidewall of the plate-type mask pattern 211 may be laterally spaced apart from a sidewall of the stack structure ST.

Subsequently, as shown in FIG. 15, an etching process with the second etch-depth 2T may be performed using the plate-type mask pattern 211 as an etch mask on the stack structure ST (S30). The second etch-depth 2T may correspond to the vertical pitch P of the stacked horizontal layers 100. In other words, portions of two horizontal layers 100 and two interlayer insulating layers 200 may be anisotropically etched by the etching process with the second etch-depth. The stack structure ST may have a height difference corresponding to twice the vertical pitch T under a region E1' etched by the second etch-depth 2T.

Figure 16:
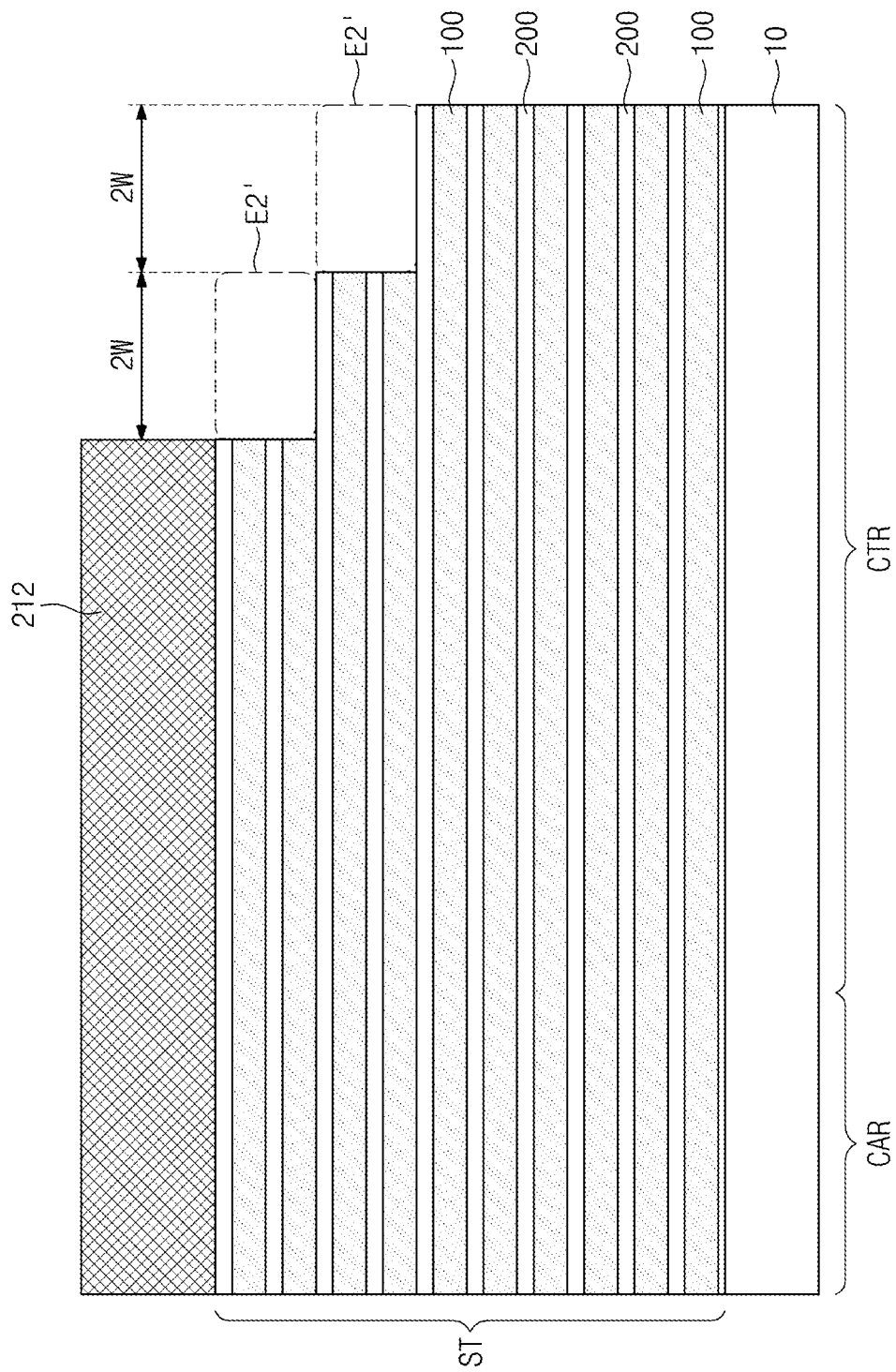

Referring to FIGS. 14 and 16, the process of shrinking an area of the plate-type mask pattern 211 may be performed (S40). Thus, a first sub-mask pattern 212 may be formed on the stack structure ST.

In example embodiments of inventive concepts, the sidewall of the plate-type mask pattern 211 may be laterally etched by the second horizontal distance 2 W through the shrinking process. The second horizontal distance 2 W may be substantially equal to or greater than twice the vertical pitch T of the horizontal layers 100. Since the area of the plate-type mask pattern 211 has shrunk, an exposed area of the stack structure ST in the contact region CTR may increase.

The etching process with the second etch-depth may be re-performed using the first sub-mask pattern 212 corresponding to the shrunk plate-type mask pattern 211 as an etch mask. The stack structure ST may have an etched region E2' of a height corresponding to twice the vertical pitch T of the horizontal layers 100 in the contact region CTR by the etching process using the first sub-mask pattern 212 as the etch mask. Thus, a vertical height of the stack structure exposed by the first sub-mask pattern 212 may be regularly reduced by twice the vertical pitch T of the horizontal layers 100.

Figure 17:
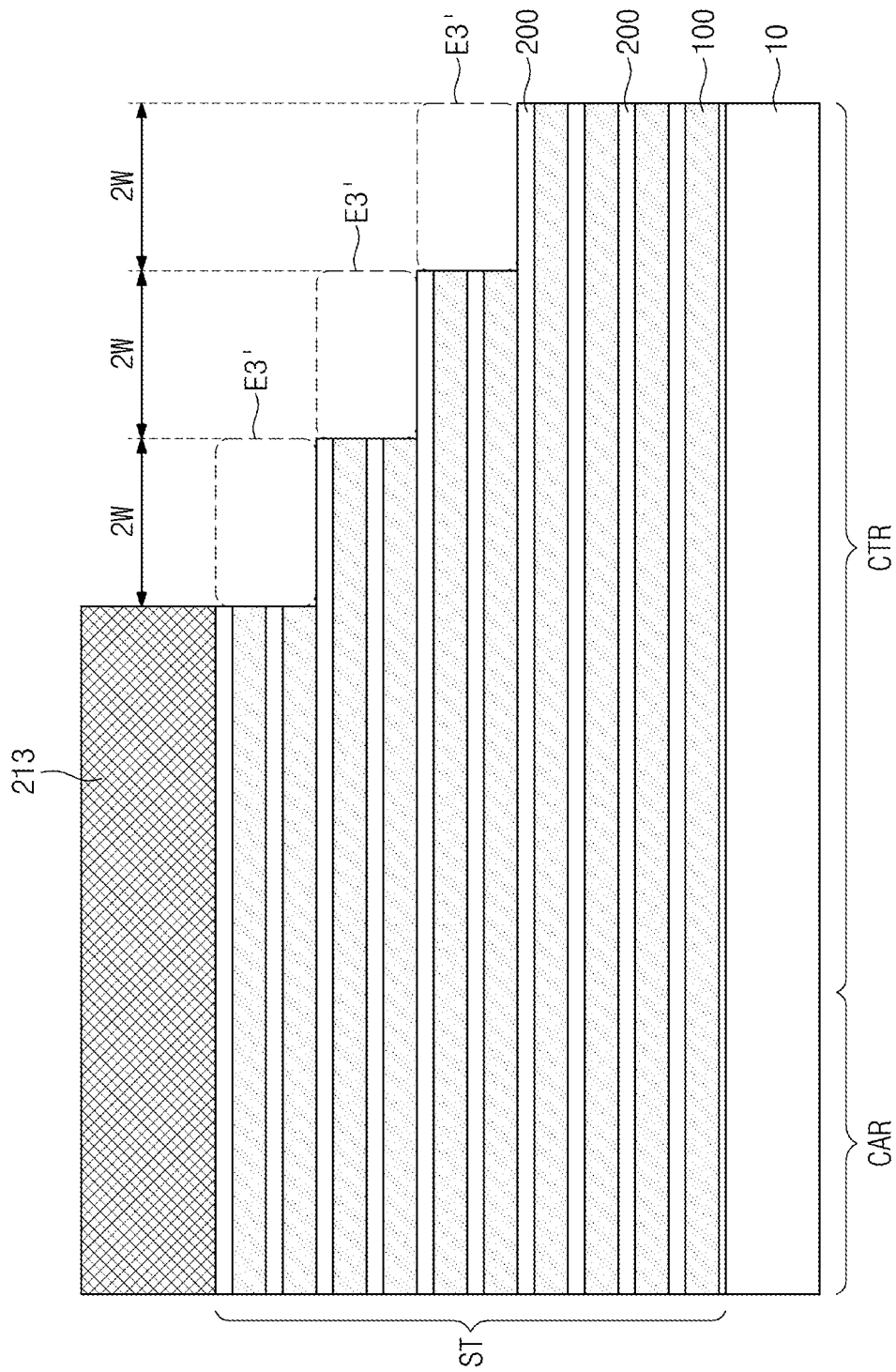

Referring to FIG. 17, an area of the first sub-mask pattern 212 may be shrunken to form a second sub-mask pattern 213. A sidewall of the second sub-mask pattern 213 may be disposed at a position spaced apart from the sidewall of the first sub-mask pattern 212, which was used previously, by the second horizontal distance 2 W. Thus, the sidewall of the second sub-mask pattern 213 may be spaced apart from the outer sidewall of the stack structure ST by three times the second horizontal distance 2 W corresponding to a horizontal distance of each of stairs generated by height difference.

Subsequently, the etching process with the second etch-depth may be re-performed using the second sub-mask pattern 213 as an etch mask on the stack structure ST. Thus, two horizontal layers 100 covered in the previous etching process with the second etch-depth may be anisotropically etched. The stack structure ST may have an etched region E3 of a height corresponding to twice the vertical pitch T of the horizontal layers 100 in the contact region CTR by the etching process using the second sub-mask pattern 213 as the etch mask. As the process of shrinking the plate-type mask pattern 211 and the etching process with the second etch-depth are repeatedly performed, an area of the etched region E3' may increase.

Figure 18:
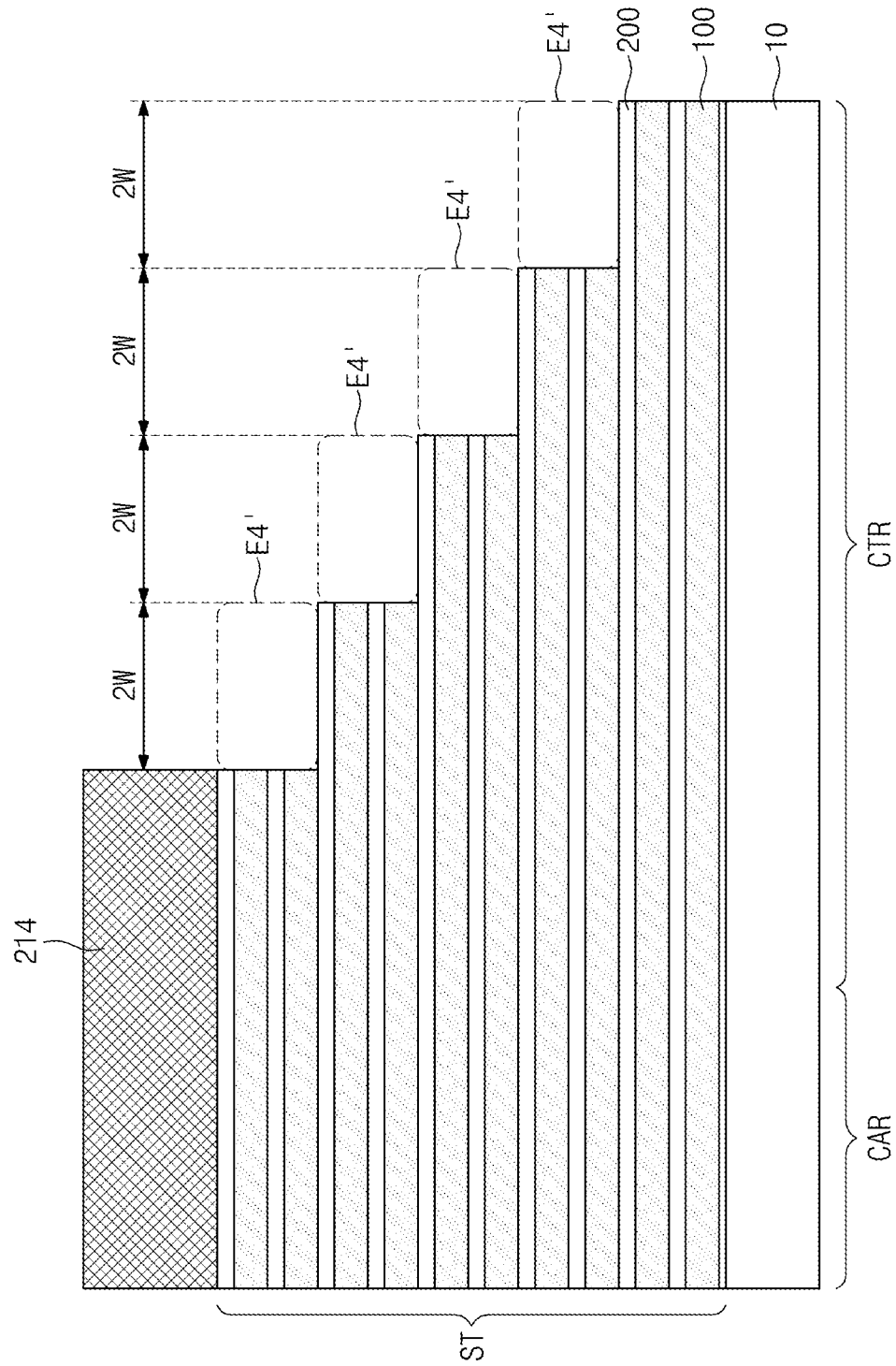

Referring to FIG. 18, the second sub-mask pattern 213 may be shrunk to form a third sub-mask pattern 214. A sidewall of the third sub-mask pattern 214 may be laterally moved from the sidewall of the second sub-mask pattern 213 by the second horizontal distance 2 W through the shrinking process. Thus, the sidewall of the third sub-mask pattern 214 may be spaced apart from the outer sidewall of the stack structure ST by four times the second horizontal distance 2 W of each of the stairs.

Subsequently, the etching process with the second etch-depth may be performed using the third sub-mask pattern 214 as an etch mask. The stack structure ST may have an etched region E4' of a height corresponding to twice the vertical pitch T of the horizontal layers 100 by the etching process using the third sub-mask pattern 214 as the etch mask.

When the number of the stacked horizontal layers 100 is 2N (where N is a natural number), the etching process with the second etch-depth and the shrinking process of the plate-type mask pattern 211 in FIGS. 14 to 18 may be repeatedly performed N−1 times. After the etching process is repeatedly performed N−1 times, the reduced plate-type mask pattern (e.g., the third sub-mask pattern 214) may be removed.

Since the shrinking process of the plate-type mask pattern 211 and the etching process may be repeatedly performed N−1 times, the stack structure ST may be formed to have the stepped structure in the contact region CTR and the dummy region DMY. In more detail, as a distance between the sidewall of the stack structure ST and the cell array region CAR may be laterally increased stepwise by 2 W on etch step, the height of the stack structure ST may be reduced stepwise by twice the vertical pitch T of the horizontal layers 100 on each step.

Figure 19:
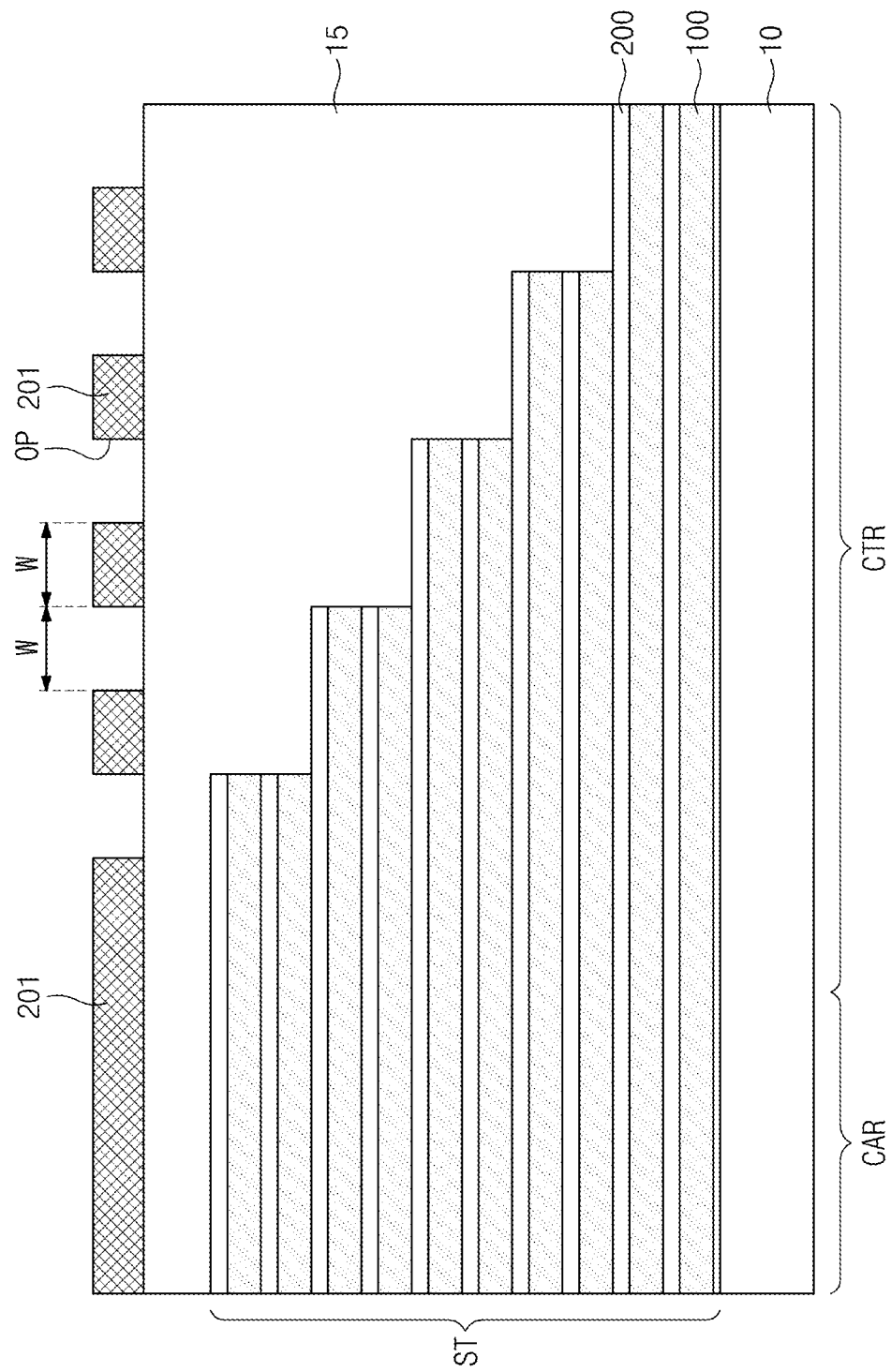

Referring to FIGS. 14 and 19, the line-type mask pattern 201 may be formed on a sacrificial layer 15 covering the stack structure ST (S50). The sacrificial layer 15 may cover the cell array region CAR and the contact region CTR. The line-type mask pattern 201 may cover the cell array region CAR and may have the line and space shape in the contact region CTR, as described with reference to FIG. 3. In other words, the line-type mask pattern 201 may have openings OP extending in one direction in the contact region CTR, as illustrated in FIG. 11. In example embodiments of inventive concepts, a distance W between the openings OP may be substantially equal to a width W of the opening OP. In example embodiments of inventive concepts, the openings OP of the line-type mask pattern 201 on the sacrificial layer 15 may be disposed over even-numbered horizontal layers 100, respectively. Additionally, the width W of the opening OP may be a half of the lateral movement distance 2 W (or a laterally etched distance) of the sidewall of the plate-type mask pattern in the process of shrinking the plate-type mask pattern.

Figure 20:
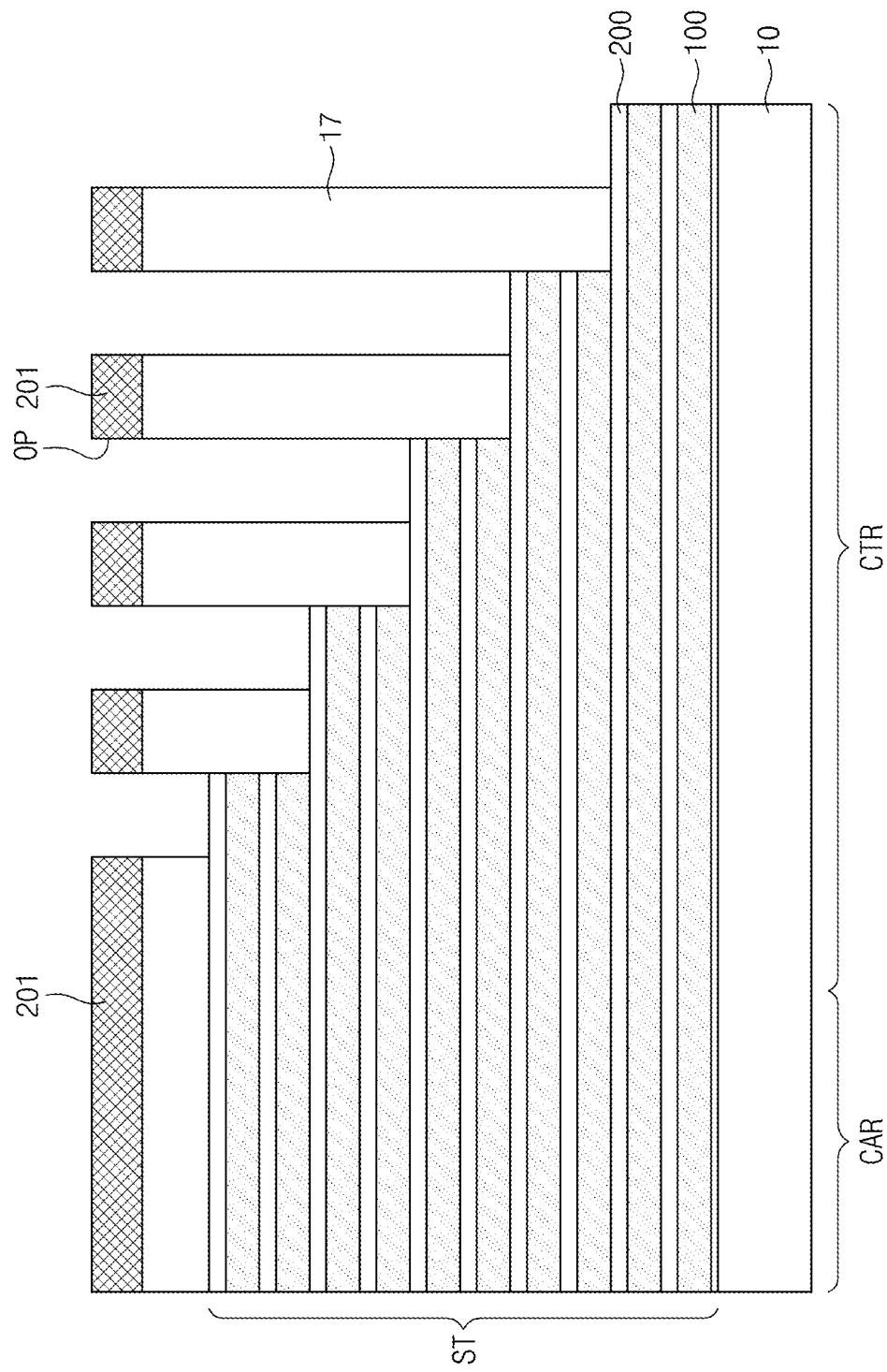

Referring to FIG. 20, the sacrificial layer 15 may be anisotropically etched using the line-type mask pattern 201 as an etch mask, thereby forming sacrificial patterns 17. At this time, etched depths of the sacrificial layer 15 respectively exposed by the openings OP may be different from each other. In example embodiments of inventive concepts, widths of the openings OP may be controlled to be different from each other for reducing width variation of openings between the sacrificial patterns 17, which may be caused by differences between the etch depths of the sacrificial layer 15.

In the contact region CTR, each of the sacrificial patterns 17s may be disposed on each of the even-numbered horizontal layers 100 and may cover the sidewall of the stack structure that is disposed between the stairs and is laterally adjacent to each of the sacrificial patterns 17. Since the line-type mask pattern 201 is used as the etch mask, the sacrificial patterns 17 may have linear shapes. Vertical lengths of the sacrificial patterns 17 may increase as a distance from the cell array region CAR increases.

Figure 21:
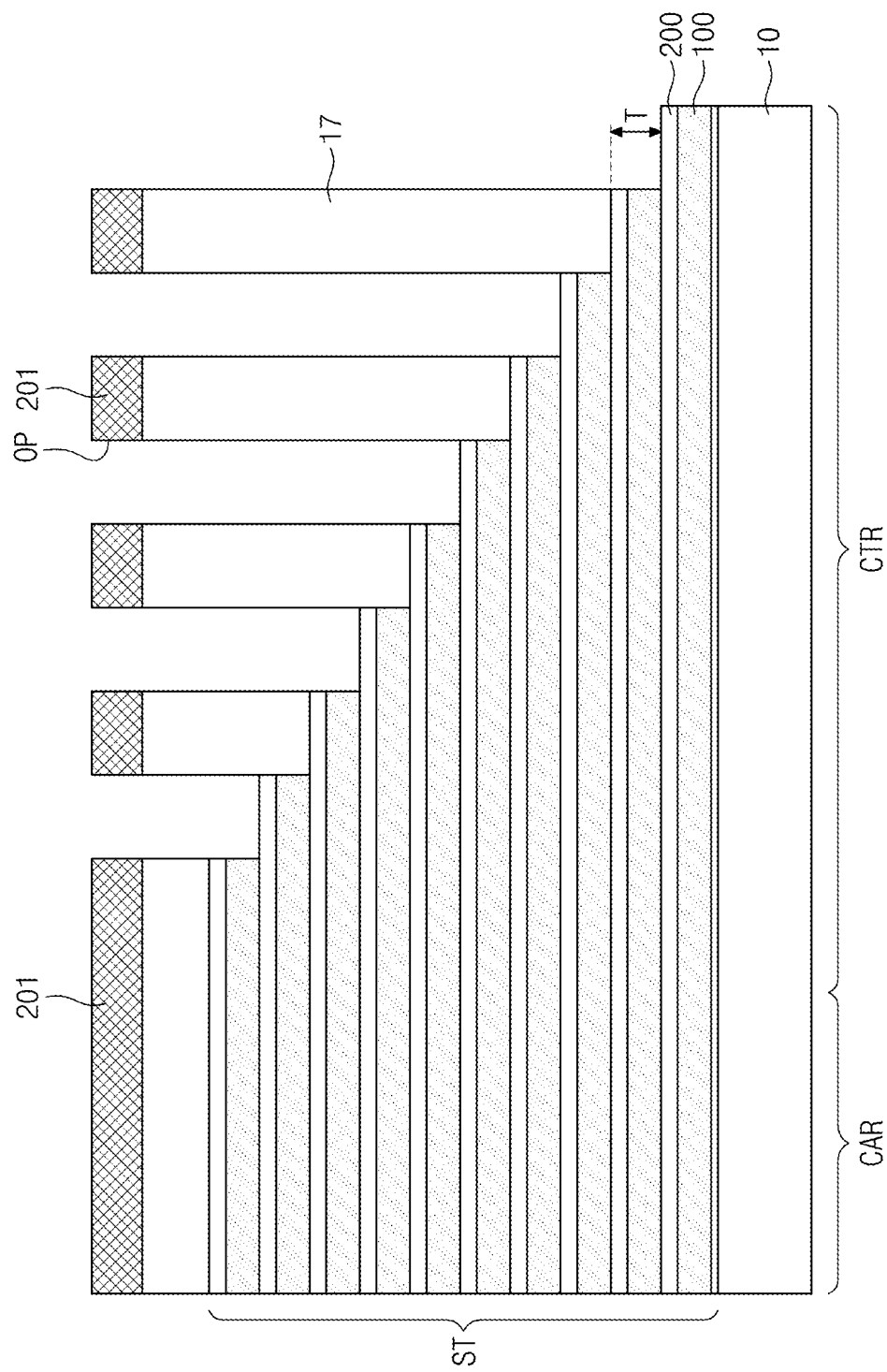

Referring to FIGS. 14 and 21, the etching process with the first etch-depth T may be performed using the line-type mask pattern 201 as an etch mask on the stack structure ST (S60). The first etch-depth T may be smaller than the second etch-depth 2T of the etching process performed using the plate-type mask pattern 211. In example embodiments of inventive concepts, the first etch-depth T may be a half of the second etch-depth 2T. Additionally, the first etch-depth T may correspond to the vertical pitch T between the horizontal layers 100 vertically adjacent to each other. Thus, the even-numbered horizontal layers 100 may be anisotropically etched at the same time by the etching process with the first etch-depth T, thereby exposing portions of odd-numbered horizontal layers 100 or the interlayer insulating layers 200 disposed on the portions of the odd-numbered horizontal layers 100.

Meanwhile, line patterns of the line-type mask pattern 201 may also cover portions having the height differences of the stack structure ST, respectively, as illustrated in FIG. 22. In this case, the stack structure ST and separated residual patterns RP may be formed by the etching process using the line-type mask pattern 201, as illustrated in FIG. 23.

Figure 25:
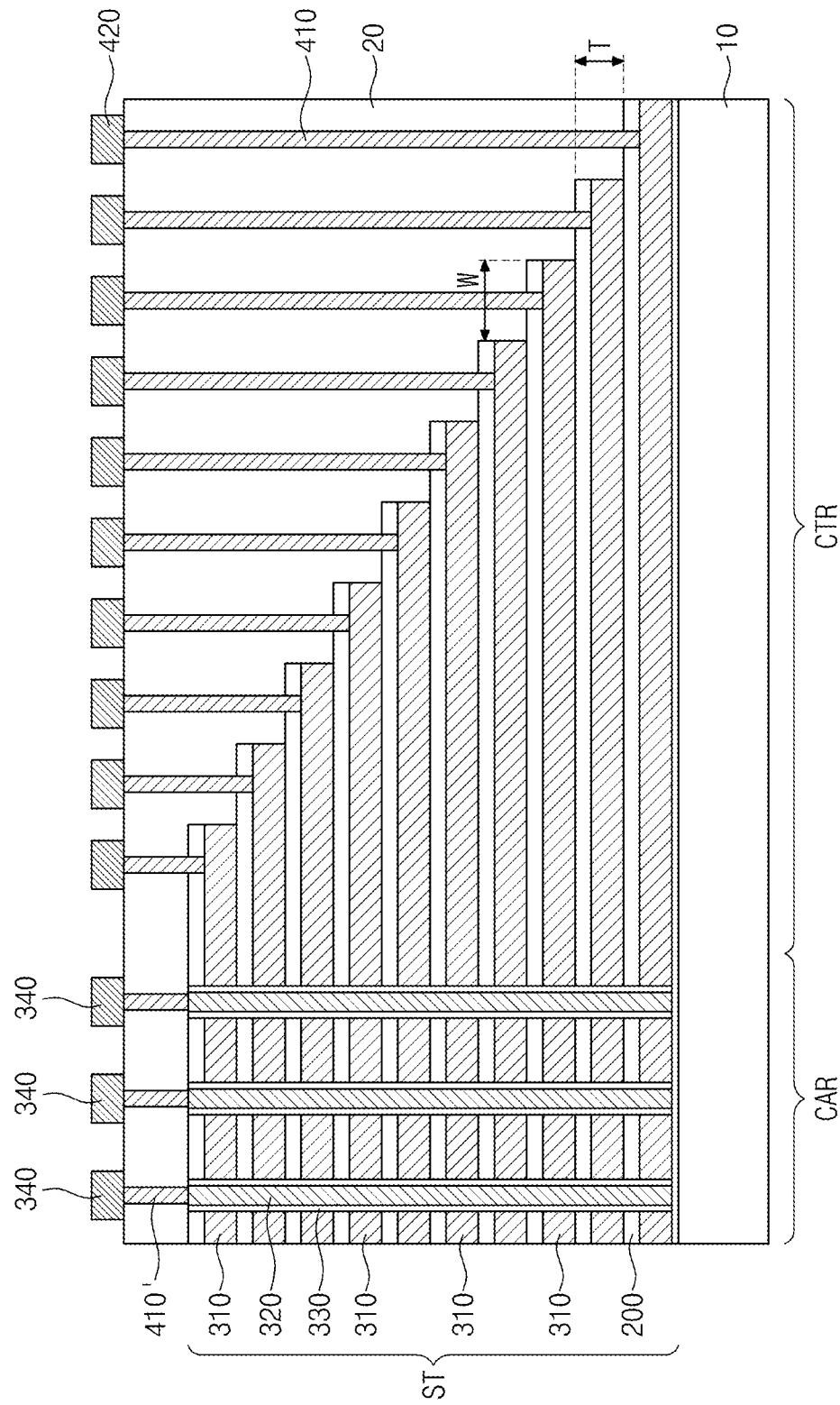
FIG. 25 is a cross-sectional view taken along a line XXV-XXV' of FIG. 24.

FIG. 24 is a plan view of a portion 'A' of FIG. 13 to illustrate a portion of a 3D semiconductor device formed using a method of fabricating a 3D semiconductor device according to example embodiments of inventive concepts. FIG. 25 is a cross-sectional view taken along a line XXV-XXV' of FIG. 24, and FIG. 26 is a cross-sectional view taken along a line XXVI-XXVI' of FIG. 24.

As illustrated in FIG. 13, a substrate 10 may include a cell array region CAR and contact regions CTR respectively disposed at both sides of the cell array region CAR in a first direction D1. Also, the substrate 10 may include the cell array region CAR and dummy regions DMY respectively disposed at both sides of the cell array region CAR in a second direction D2 perpendicular to the first direction D1.

Figure 26:
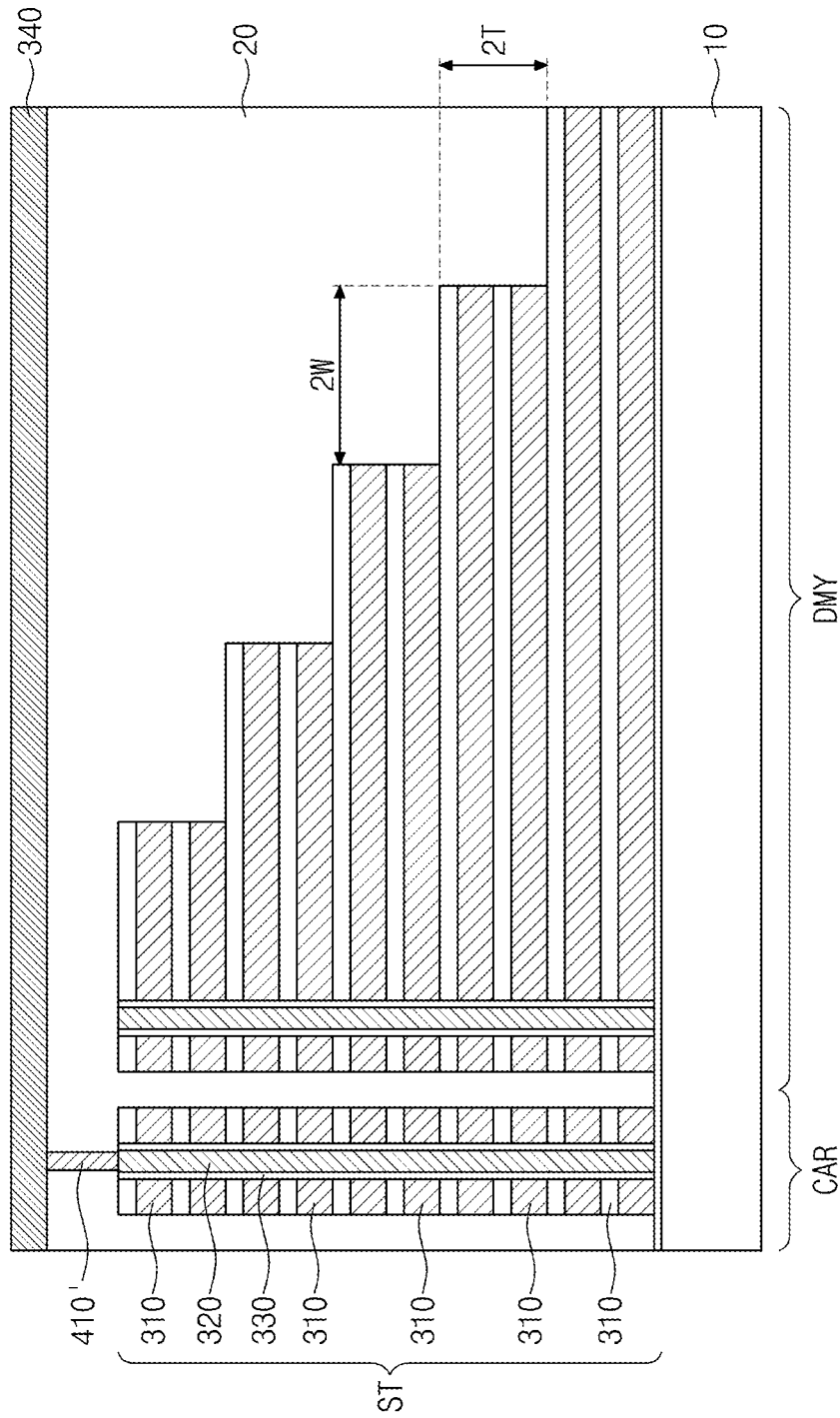
FIG. 26 is a cross-sectional view taken along a line XXVI-XXVI' of FIG. 24.

Referring to FIGS. 24, 25, and 26, a stack structure ST may be disposed on the substrate 10. The stack structure ST may include 2N horizontal electrodes 310 stacked on the substrate 10, where N is a natural number. The stack structure ST may be formed by one of the fabricating methods according to example embodiments described above. In other words, the horizontal electrodes 310 may correspond to the horizontal layers 100 described with reference to FIGS. 2 to 23, and interlayer insulating layers 200 may be disposed between the horizontal electrodes 310.

The stack structure ST may have a first stepped structure disposed in the contact region CTR as illustrated in FIG. 25 and may have a second stepped structure disposed in the dummy region DMY as illustrated in FIG. 26. In the stack structure ST, each of the horizontal electrodes 310 may have a first sidewall disposed in the contact region CTR and a second sidewall disposed in the dummy region DMY.

In more detail, the first sidewalls of the horizontal electrodes 310 may be disposed at horizontal positions different from each other, respectively. In example embodiments of inventive concepts, the first sidewalls of the horizontal electrodes 310 may be horizontally spaced apart from each other at intervals of a first horizontal distance W in the contact region CTR. In the contact region CTR, a vertical height of the stack structure ST may increase stepwise with a first vertical pitch T toward the cell array region CAR. In other words, end portions of the horizontal electrodes 310 may be disposed at positions horizontally different from each other, respectively, in the contact region CTR.

The second sidewalls of at least two horizontal electrodes vertically adjacent to each other may be vertically aligned with each other in the dummy region DMY. In example embodiments of inventive concepts, the second sidewalls of odd-numbered horizontal electrodes 310 may be horizontally spaced apart from each other at intervals of the second horizontal distance 2 W in the dummy region DMY. Likewise, the second sidewalls of even-numbered horizontal electrodes 310 may be horizontally spaced apart from each other at intervals of the second horizontal distance 2 W in the dummy region DMY. Here, the second horizontal distance 2 W may be twice the first horizontal distance W. A vertical height of the stack structure ST may increase stepwise with a second vertical pitch 2T equal to twice the first vertical pitch T toward the cell array region CAR. In the dummy region DMY, the odd-numbered horizontal electrodes 310 may be disposed at positions horizontally different from each other, respectively, and the even-numbered horizontal electrodes 310 may be disposed at position horizontally different from each other, respectively. Additionally, end portions of the odd-numbered horizontal electrodes 310 may be disposed under end portions of the even-numbered horizontal electrodes 310, respectively.

In example embodiments of inventive concepts, the horizontal electrodes 310 may have plate-type structures completely covering the cell array region CAR. Alternatively, the horizontal electrodes 310 may have line-type structures extending in the first direction D1 in the cell array region CAR, as illustrated in FIG. 24. As shown in FIGS. 25-26, a vertical electrode 320 may be surrounded by a data storage layer 330. The vertical electrode 320 may be electrically connected to bit lines 340 through contact plugs 410'. A structure of the cell array region CAR will be described in more detail with reference to FIGS. 27 to 31 later.

A wiring structure may be disposed on the stack structure ST having the stepped structure. The wiring structure may include contact plugs 410 and conductive pads 420. The contact plugs 410 may penetrate a filling layer 20 and may be connected to the horizontal electrodes 310 in the contact region CAR. The conductive pads 420 may be connected to the contact plugs 410, respectively. The contact plugs 410 may be connected to the horizontal electrodes 310 disposed at levels different from each other, respectively.

In example embodiments of inventive concepts, as illustrated in FIG. 23, the residual patterns RP may be disposed at the same levels as the horizontal electrodes 310, respectively. The residual patterns RP are separated from the horizontal electrodes 310. The residual pattern RP may include the same material as the horizontal electrode 310. The residual patterns RP may be spaced apart from the contact plugs 420 and may be electrically floated.

Figure 27:
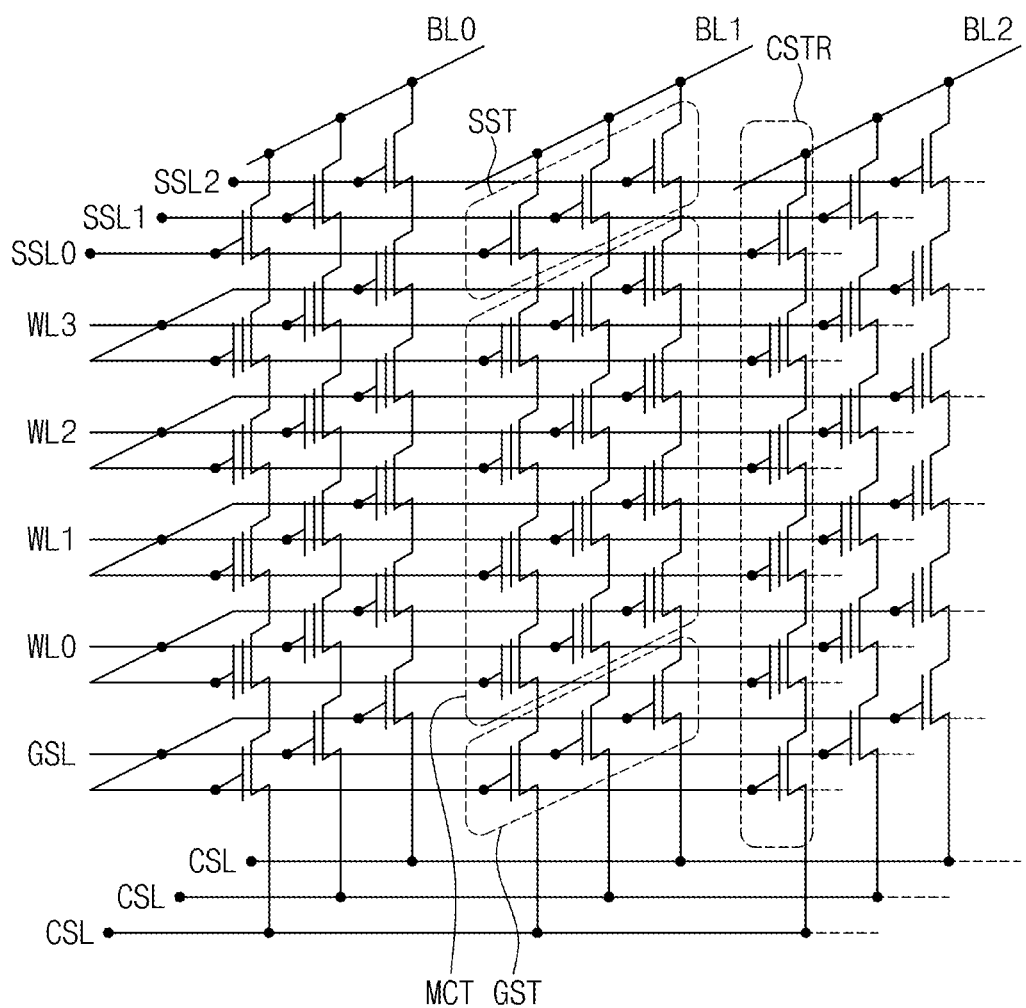
FIGS. 27 and 28 are circuit diagrams illustrating a 3D semiconductor device according to example embodiments of inventive concepts.
Figure 28:
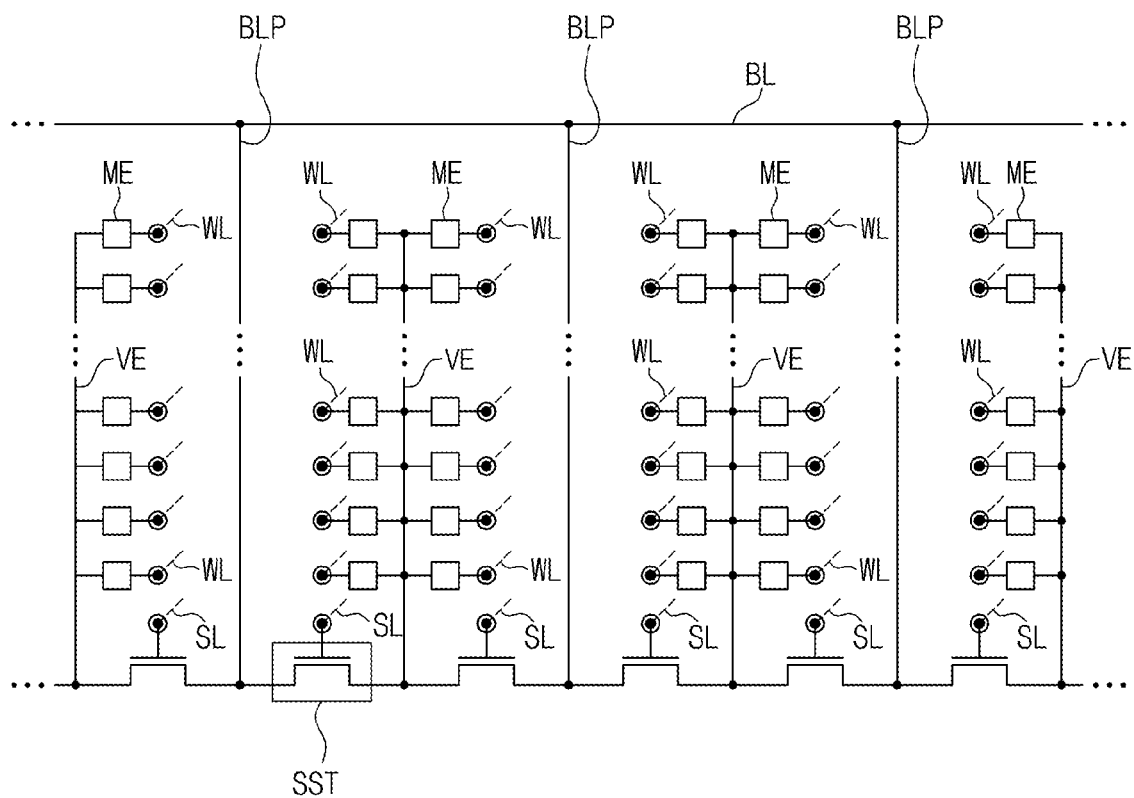

FIGS. 27 and 28 are circuit diagrams illustrating a 3D semiconductor memory device according to example embodiments of inventive concepts.

Referring to FIG. 27, a 3D semiconductor memory device may include common source lines CSL, a plurality of bit lines BL0, BL1, and BL2, and a plurality of cell strings CSTR disposed between each of the common source lines CSL and the bit lines BL0, BL1, and BL2. The bit lines BL0 to BL4 may correspond to the bit lines 340 described previously with reference to FIGS. 25-26.

The common source line CSL may be a conductive layer disposed on the substrate 10 or a dopant region formed in the substrate 10. The bit lines BL0, BL1, and BL2 may be conductive patterns (e.g., metal lines) spaced apart from the substrate 10 and disposed over the substrate 10. The bit lines BL0, BL1, and BL2 may be two-dimensionally arranged, and each of the bit lines BL0, BL1, and BL2 is connected in parallel to a plurality of the cell strings CSTR. Thus, the cell strings CSTR may be two-dimensionally arranged on the common source line CSL or the substrate 10.

Each of the cell strings CSTR may consist of a ground selection transistor GST connected to the common source line CSL, a string selection transistor SST connected to each of the bit lines BL0, BL1, and BL2, and a plurality of memory cell transistors MCT between the ground and string selection transistors GST and SST. The ground selection transistor GST, the memory cell transistors MCT, and the string selection transistor SSG may be connected in series to each other. A ground selection line GSL, a plurality of word lines WL0 to WL3, and string selection lines SSL0 to SSL2 between the common source lines CSL and the bit lines BL0 to BL2 may be used as gate electrodes of the ground selection transistors GST, memory cell transistors MCT, and the string selection transistors SST, respectively.

All of the ground selection transistors GST may be disposed at substantially the same distance from the substrate 10, and the gate electrodes of the ground selection transistors GST may be connected in common to the ground selection line GSL, so as to be in equipotential state. Likewise, the gate electrodes of a plurality of the memory cell transistors disposed at substantially the same distance from the common source line CSL may be connected in common to one of the word lines WL0 to WL3, so as to be in equipotential state. Since one cell string CSTR includes memory cell transistors MCT respectively disposed at different distances from each other from the common source line CSL, the plurality of word lines WL0 to WL3 may be disposed at different levels from each other between the common source line CSL and the bit lines BL0 to BL2. The plurality of word lines WL0 to WL3, which are sequentially stacked, may be formed to have the aforementioned technical features of the 3D semiconductor devices according to embodiments of inventive concepts.

Each of the cell strings CSTR may include an active pattern (e.g., a vertical electrode 320 of FIGS. 29, 30, and 31) vertically extending from the common source line CSL to one of the bit lines BL0 to BL3. The active pattern is connected to one of the bit lines BL0 to BL3. A data storage layer (e.g., a numeral '330' of FIGS. 29, 30, and 31) may be disposed between the active pattern and the word lines WL0 to WL3. In example embodiments of inventive concepts, the charge storage layer may include a material or layer-structure capable of storing charges. For example, the charge storage layer may include at least one of a trap-site rich insulation layer such as a silicon nitride layer, a floating gate, or an insulating layer including conductive nano dots.

Referring to FIG. 28, a plurality of selection transistors SST may be connected in parallel to a bit line BL through a plurality of bit line plugs BLP. Each of the bit line plugs BLP may be connected in common to a pair of the selection transistors SST adjacent thereto.

A plurality of word lines WL and a plurality of vertical electrodes VE may be disposed between the bit line BL and the selection transistors SST. The word lines WL may be constituted to have the aforementioned technical features according to embodiments of inventive concepts. The vertical electrodes VE may be disposed between the bit line plugs BLP. For example, the vertical electrodes VE and the bit line plugs BLP may be alternately arranged along a direction parallel to the bit line BL. Each of the vertical electrodes VE may be connected in common to a pair of the selection transistors SST adjacent thereto.

A plurality of memory elements ME may be connected in parallel to each of the vertical electrodes VE. Each of the memory elements ME may be connected to corresponding one of the word lines WL. In other words, each of the word lines WL may be connected to corresponding one of the vertical electrodes VE through corresponding one of the memory elements ME.

Each of the selection transistors SST may include a selection line SL functioning as a gate electrode thereof. In example embodiments of inventive concepts, the selection lines SL may be parallel to the word lines WL.

The 3D semiconductor memory devices according to embodiments of inventive concepts are described as examples with reference to FIGS. 27 and 28. However, the inventive concept is not limited thereto.

Figure 29:
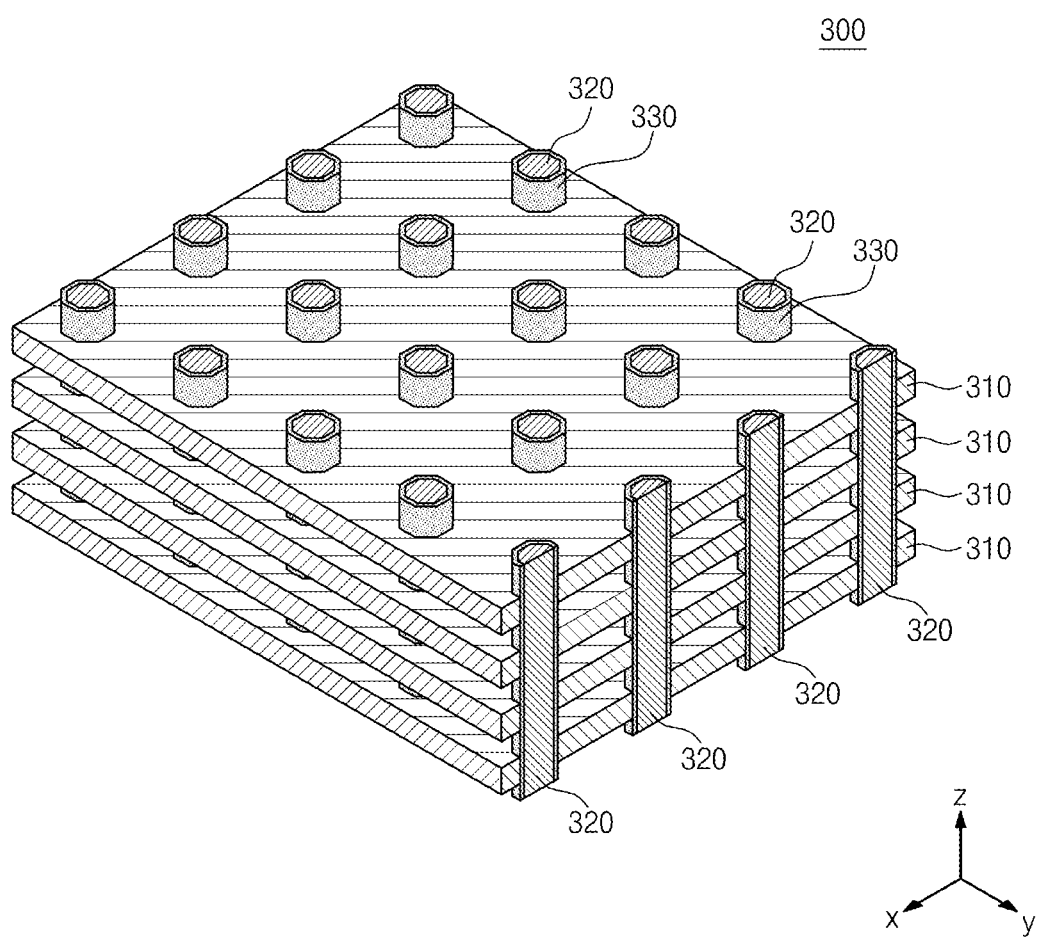
FIGS. 29 to 31 are perspective views illustrating cell array structures of a 3D semiconductor device according to example embodiments of inventive concepts.
Figure 30:
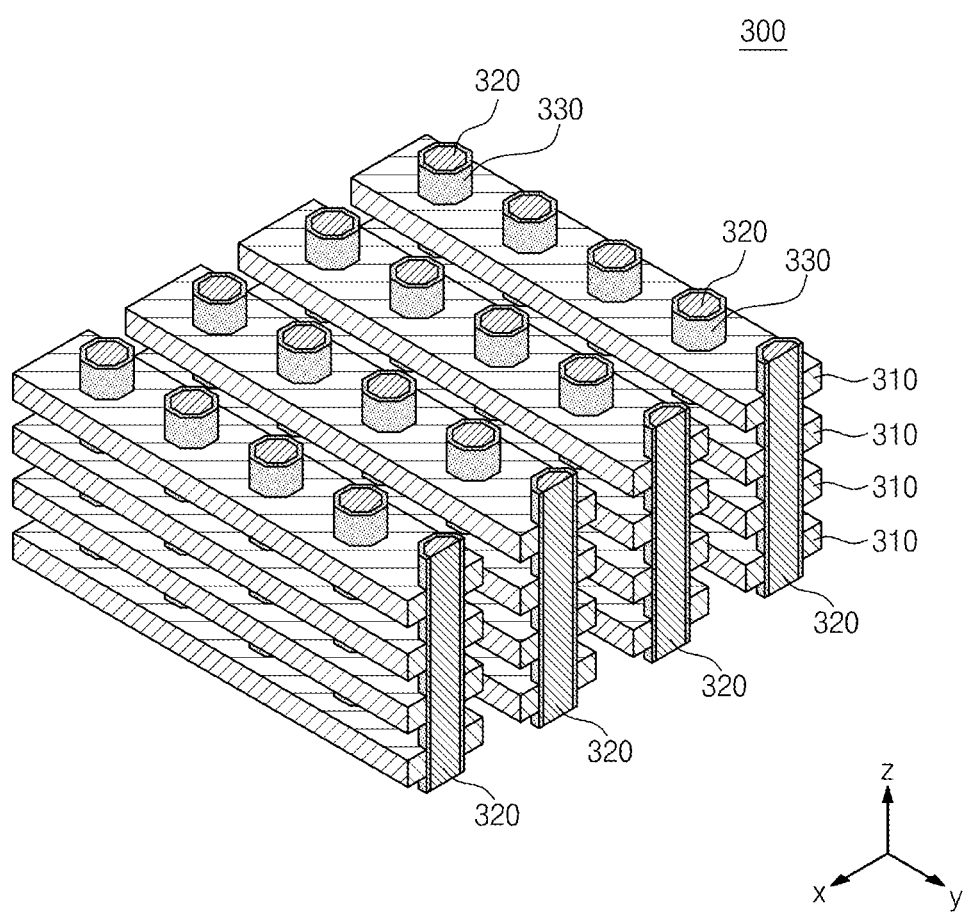
Figure 31:
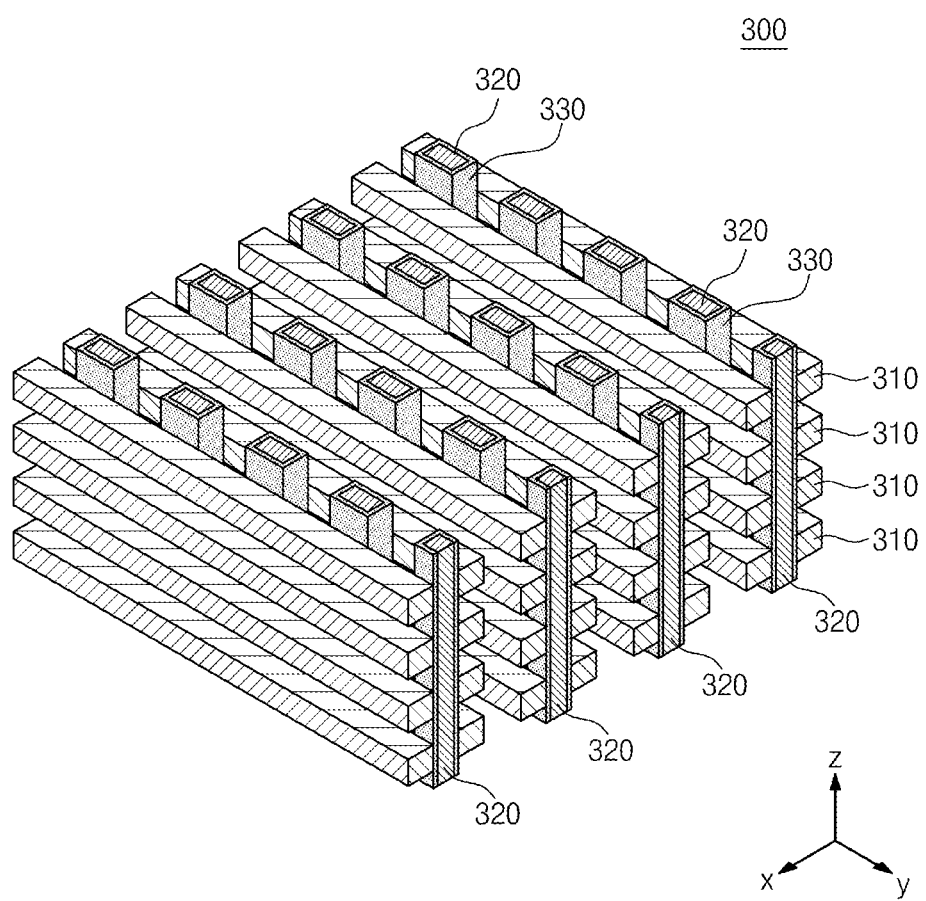

FIGS. 29 to 31 are perspective views illustrating cell array structures of a 3D semiconductor device according to example embodiments of inventive concepts.

A memory structure 300 according to embodiments of inventive concepts may include a plurality of horizontal electrodes 310 and a plurality of vertical electrodes 320. The plurality of horizontal electrodes 310 may be parallel to a xy plane and may be disposed at heights different from each other from a lower structure, respectively. The plurality of vertical electrodes 320 may cross the horizontal electrodes 310 along a direction vertical to a top surface of the lower structure. Additionally, the memory structure 300 may further include data storage patterns 330 disposed between the horizontal electrodes 310 and the vertical electrodes 320.

In a 3D semiconductor device according to example embodiments, as illustrated in FIG. 29, each of the horizontal electrodes 310 may have a plate shape. For example, each of the horizontal electrodes 310 may have lengths ten or more times greater than those of each of the vertical electrodes 320 in x and y directions, respectively, in a plan view. Each of the horizontal electrodes 310 may be formed to define a plurality of holes which are two-dimensionally arranged and penetrate each of the horizontal electrodes 310. The vertical electrodes 320 may be disposed to vertically pass through the holes of the horizontal electrodes 310 disposed at the heights different from each other.

In example embodiments of inventive concepts, as illustrated in FIG. 30, horizontal electrodes 310 may be spaced apart from each other in the x-direction and the z-direction, so as to be three-dimensionally arranged. Each of the horizontal electrodes 310 may have a linear shape crossing a plurality of vertical electrodes 320. Each of the horizontal electrodes 310 may be one-dimensionally arranged to have a plurality of holes penetrating each of the horizontal electrodes 310, and the vertical electrodes 320 may vertically pass through the holes of the horizontal electrodes 310 disposed at heights different from each other.

In example embodiments of inventive concepts, as illustrated in FIG. 31, horizontal electrodes 310 may be spaced apart from each other in the x-direction and z-direction, so as to be three-dimensionally arranged. Each of the horizontal electrodes 310 may have linear shapes crossing a plurality of vertical electrodes 320. In the present embodiment, the vertical electrodes 320 may be horizontally spaced apart from each other in a region including a plurality of vertical electrodes 320 which are at least one-dimensionally arranged.

For example, a pair of the horizontal electrodes 310 respectively disposed at both sides of each vertical electrode 320 may be horizontally separated from each other and may have different potentials from each other. In example embodiments of inventive concepts, even though not shown in the drawings, one of the pair of horizontal electrodes 310 may be connected to an external circuit through a left end thereof, and the other of the pair of horizontal electrodes 310 may be connected to another external circuit through a right end thereof.

In a 3D semiconductor memory device according to example embodiments of inventive concepts, the pair of horizontal electrodes 310 disposed at both sides of each vertical electrode 320 may be electrically connected to each other and may be in an equipotential state.

Figure 32:
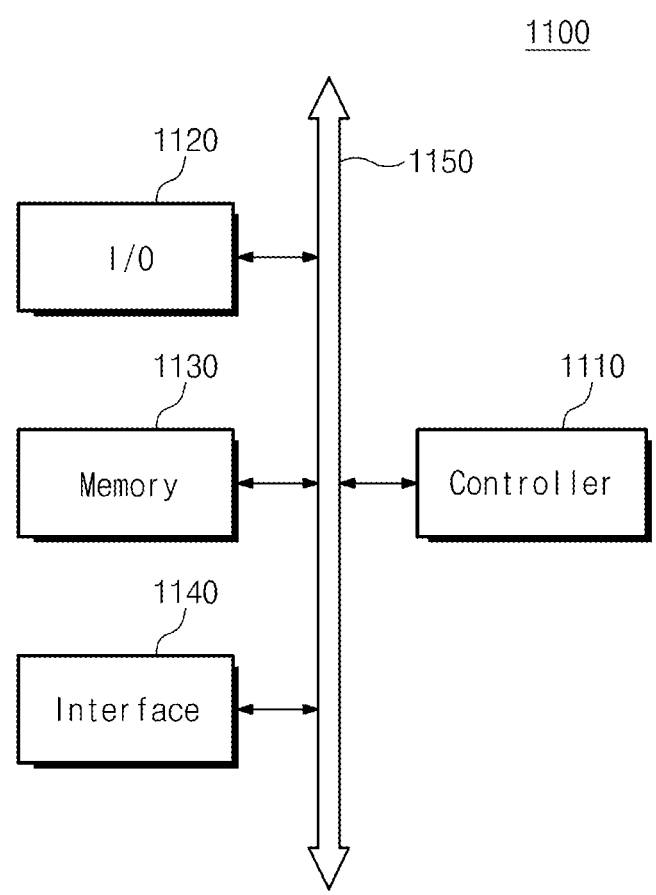
FIG. 32 is a schematic block diagram illustrating an example of memory systems including 3D semiconductor devices according to example embodiments of inventive concepts.

FIG. 32 is a schematic block diagram illustrating an example of memory systems including 3D semiconductor devices according to example embodiments of inventive concepts.

Referring to FIG. 32, a memory system 1100 may be applied to a personal digital assistant (PDA), a portable computer, a web tablet, a wireless phone, a mobile phone, a digital music player, a memory card or other electronic products. The other electronic products may receive or transmit information data by wireless.

The memory system 1100 may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150.

The controller 1110 may include at least one of a microprocessor, a digital signal processor, a microcontroller or another logic device. The other logic device may have a similar function to any one of the microprocessor, the digital signal processor and the microcontroller. The memory device 1130 may store data and/or commands executed by the controller 1110. The I/O unit 1120 may receive data or signals from an external system or may transmit data or signals to the external system. For example, the I/O unit 1120 may include a keypad, a keyboard and/or a display unit.

The memory device 1130 may include at least one of the 3D semiconductor devices according to the embodiments described above. The memory device 1130 may further include at least one of various types of semiconductor memory devices.

The interface unit 1140 may transmit data to a communication network or may receive electrical data from a communication network.

Figure 33:
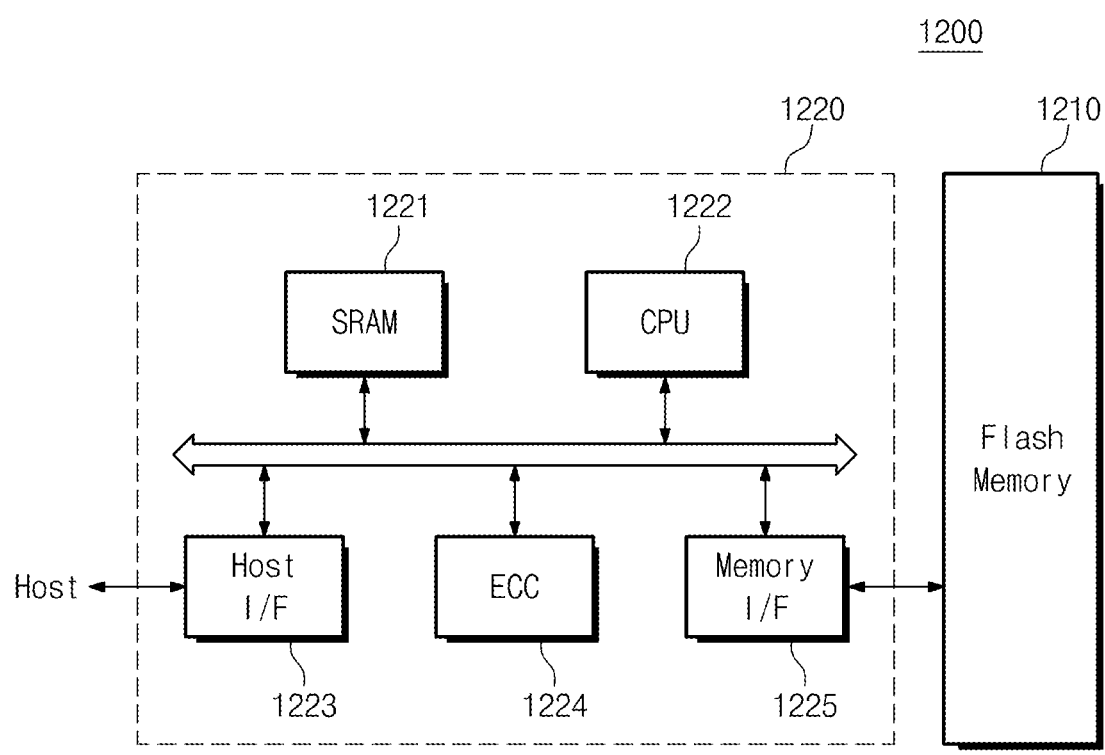
FIG. 33 is a schematic block diagram illustrating an example of memory cards including 3D semiconductor devices according to example embodiments of inventive concepts.

FIG. 33 is a schematic block diagram illustrating an example of memory cards including 3D semiconductor devices according to example embodiments of inventive concepts.

Referring to FIG. 33, according to example embodiments of inventive concepts, a memory card 1200 capable of storing data may include a flash memory device 1210 according to embodiments of inventive concepts. The memory card 1200 may include a memory controller 1220 that controls data communication between a host and the memory device 1210.

A static random access memory (SRAM) device 1221 may be used as an operation memory of a central processing unit (CPU) 1222. A host interface unit 1223 may be configured to include a data communication protocol between the memory card 1200 and the host. An error check and correction (ECC) block 1224 may detect and correct errors of data which are read out from the flash memory device 1210. A memory interface unit 1225 may interface with the flash memory device 1210 according to embodiments of inventive concepts. The CPU 1222 may control overall operations of the memory controller 1220 for exchanging data. Even though not shown in the drawings, the memory card 1200 may further include a read only memory (ROM) device that stores code data to interface with the host. The memory card 1200 may be used as a portable data storage card.

The memory system 1100 and/or memory card 1200 may realized as solid state disks (SSD). Solid state disks may be used as hard disks of computer systems.

Figure 34:
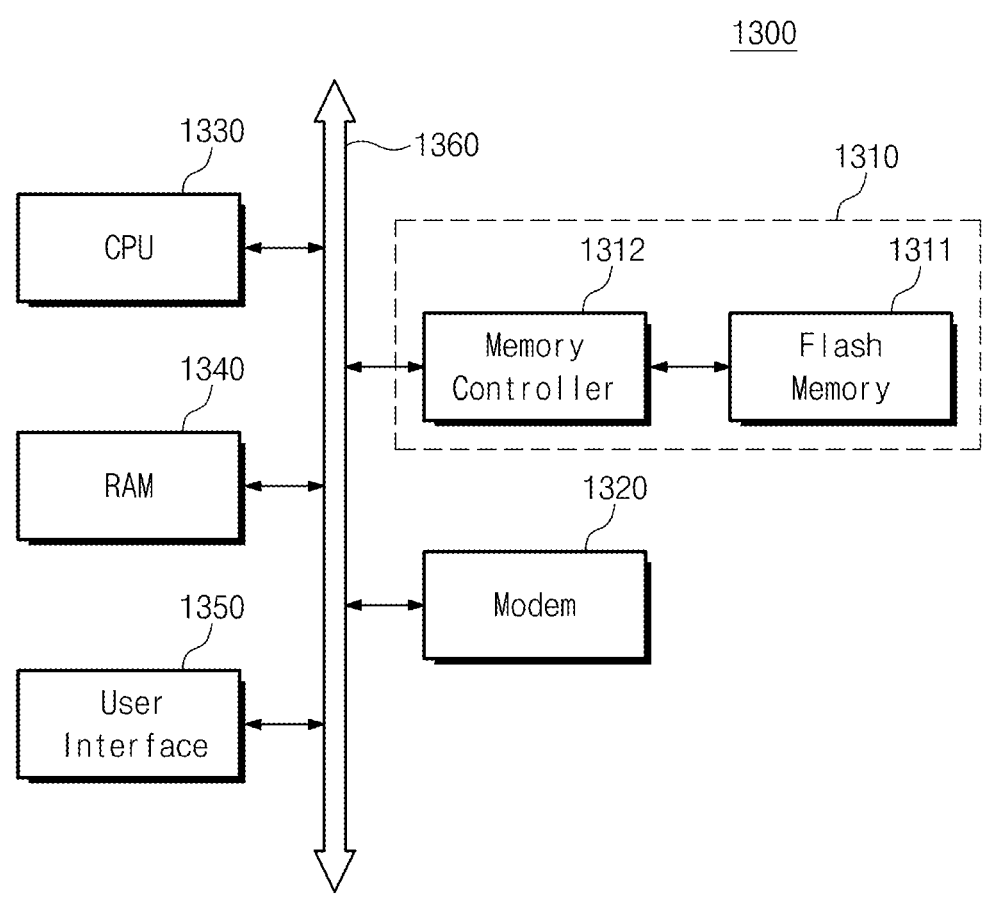
FIG. 34 is a schematic block diagram illustrating an example of information processing systems including 3D semiconductor devices according to example embodiments of inventive concepts.

FIG. 34 is a schematic block diagram illustrating an example of information processing systems including 3D semiconductor devices according to example embodiments of inventive concepts.

Referring to FIG. 34, according to example embodiments of inventive concepts, a flash memory system 1310 may be applied to an information processing system such as a mobile device or a desktop computer. An information processing system 1330 according to example embodiments of inventive concepts may include a modem 1320, a central processing unit (CPU) 1330, a random access memory (RAM) 1340, and a user interface unit 1350 that are electrically connected to the flash memory system 1310 through a system bus 1360. The flash memory system 1310 may have substantially the same structure as the aforementioned memory system or flash memory system. The flash memory system 1310 may store data processed by the central processing unit 430 or data inputted from an external system. The flash memory system 1310 may be realized as a solid state disk (SSD). In this case, the information processing system 1300 may stably and reliably store massive data in the flash memory system 1310. The increase in reliability enables the flash memory system 1310 to conserve resources for error correction, such that a high speed data exchange function may be provided to the information processing system 1300. Although not shown in the drawings, the information processing system 1300 may further include an application chipset, a camera image processor (CIS), and/or an input/output device.

A flash memory system or memory system according to example embodiments of inventive concepts may be encapsulated using various packaging techniques. For example, a flash memory system or memory system according to example embodiments of inventive concepts may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

According to example embodiments of inventive concepts, when the stepped structure of the stack structure including the vertically stacked horizontal layers is formed in the contact region, it is possible to reduce the number of the photolithography processes for patterning the stacked horizontal layers. Additionally, the stepped structure may be formed at the horizontal layers disposed at heights different from each other at the same time by once etching process. Thus, even though the number of the stacked horizontal layers increases, the number of the etching processes performed on the horizontal layers may be reduced.

While some example embodiments of inventive concepts have been particularly shown and described, it will be understood by one of ordinary skill in the art that variations in form and detail may be made therein without departing from the spirit and scope of the claims.

What is claimed is:

1. A method of fabricating a three-dimensional (3D) semiconductor device comprising:
    forming a stack structure including a plurality of horizontal layers and a plurality of interlayer insulating layers alternately stacked on a substrate, the substrate including a cell array region and a contact region;
    forming a first mask pattern covering the cell array region, the first mask pattern defining openings extending in one direction over the contact region;
    performing a first etching process with a first etch-depth using the first mask pattern as an etch mask on the stack structure;
    forming a second mask pattern covering the cell array region and exposing a part of the contact region; and
    performing a second etching process with a second etch-depth using the second mask pattern as an etch mask structure on the stack structure, the second etch-depth being greater than the first etch-depth,
    after performing the second etching process, repeatedly performing a process of shrinking a planar area of the second mask pattern and performing the second etching process using the shrunk second mask pattern as the etch mask structure.

2. A method of fabricating a three-dimensional (3D) semiconductor device comprising:
    forming a stack structure including a plurality of horizontal layers sequentially stacked on a substrate,
        the substrate including a cell array region and a contact region;
    forming a first mask pattern covering the cell array region, the first mask pattern defining openings extending in one direction over the contact region;
    performing a first etching process with a first etch-depth using the first mask pattern as an etch mask on the stack structure,
        the performing the first etching process including etching a part of the stack structure exposed by the first mask pattern to the first etch-depth using the first mask pattern as the etch mask, and
        the first etch-depth corresponds to a vertical pitch of one of the plurality of horizontal layers; and
    forming a second mask pattern covering the cell array region and exposing a part of the contact region;
    performing a second etching process with a second etch-depth using the second mask pattern as an etch mask structure on the stack structure,
        the second etch-depth being greater than the first etch-depth,
        the performing the second etching process including
        etching a portion of the stack structure exposed by the second mask pattern to the second etch-depth using the second etch pattern as the etch mask structure, and
        the second etch-depth corresponds to at least twice the vertical pitch of one of the plurality of horizontal layers.

3. The method of claim 1, wherein the performing the first etching process comprises forming horizontal patterns by anisotropically etching an uppermost horizontal layer of the plurality of horizontal layers in the stack structure.

4. The method of claim 3, wherein the performing the second etching process comprises removing an outermost one of the horizontal patterns.

5. The method of claim 1, wherein
the number of the horizontal layers in the stack structure is 2N,
N is a natural number, and
the second etching process is repeatedly performed N−1 times.

6. The method of claim 1, wherein the repeatedly performing the process of shrinking the planar area of the second mask pattern includes laterally moving a sidewall of the second mask pattern by twice a width of the opening of the first mask pattern.

7. The method of claim 1, wherein the forming the first mask pattern on the stack structure occurs after the repeatedly performing the process of shrinking the planar area of the second mask pattern and the second etching process.

8. The method of claim 7, wherein performing the first etching process comprises anisotropically etching even-numbered horizontal layers of the stacked horizontal layers in the stack structure by using the first mask pattern as the etch mask.

9. The method of claim 1, wherein
the cell array region is adjacent to the contact region in a second direction,
the substrate includes a dummy region,
the cell array region is adjacent to the dummy region in the first direction,
the second direction is perpendicular to the first direction,
the first mask pattern covers the dummy region, and
the second mask pattern exposes a portion of the dummy region.

10. A method of fabricating a three-dimensional (3D) semiconductor device comprising:
forming a stack structure including a plurality of horizontal layers stacked on a first region and a second region of a substrate,
the plurality of horizontal layers including odd horizontal layers alternately stacked with even horizontal layers;
performing one of a first process and a first method on the stack structure,
the first process including,
forming a mask on the first and second regions of the substrate,
the mask defining a plurality of openings that are spaced apart from each other over the second region of the substrate, and
etching through at least one of the even horizontal layers using the mask as an etch mask structure on the stack structure without substantially etching one of the odd horizontal layers,
the first method including,
forming a mask pattern on the first and second regions of the substrate,
the mask pattern exposing a part of the second region of the substrate,
etching through at least a pair of the plurality of horizontal layers using the mask pattern as an etch mask pattern on the stack structure,
each pair of the plurality of horizontal layers including one of the even horizontal layers that is adjacent to one of the odd horizontal layers; and
performing an other of the first process and the first method on the stack structure.

11. The method of claim 10, wherein the performing the first process occurs before the performing the first method.

12. The method of claim 10, wherein the performing the first method occurs before the performing the first process.

13. The method of claim 10, wherein the first method includes:
after performing the second etching process a first time, repeatedly performing a shrinking-and-etch process including,
shrinking a planar area of the mask pattern so more of the second region of the substrate is exposed,
repeating the etching through at least a pair of the plurality of horizontal layers using the shrunken mask pattern as the etch mask pattern.

14. The method of claim 13, wherein the stack structure includes a plurality of interlayers alternately stacked in between the plurality of horizontal layers.

15. The method of claim 1, wherein the part of the contact region exposed by the second mask pattern includes a part of an area of the contact region exposed by the first mask pattern.

16. The method of claim 1, wherein the openings defined by the first mask are spaced apart from each other in a second direction perpendicular to the first direction.

* * * * *